(12) United States Patent
Mauder et al.

(10) Patent No.: US 10,134,835 B2
(45) Date of Patent: Nov. 20, 2018

(54) POWER SEMICONDUCTOR DEVICE HAVING FULLY DEPLETED CHANNEL REGIONS

(71) Applicant: Infineon Technologies AG, Neubiberg (DE)

(72) Inventors: Anton Mauder, Kolbermoor (DE); Franz-Josef Niedernostheide, Hagen a. T.W. (DE); Frank Dieter Pfirsch, Munich (DE); Christian Philipp Sandow, Haar (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/634,720

(22) Filed: Jun. 27, 2017

(65) Prior Publication Data

US 2018/0006109 A1    Jan. 4, 2018

(30) Foreign Application Priority Data

Jun. 30, 2016    (DE) ........................ 10 2016 112 019

(51) Int. Cl.
| | |
|---|---|
| *H03K 3/00* | (2006.01) |
| *H01L 29/06* | (2006.01) |
| *H01L 29/10* | (2006.01) |
| *H01L 29/739* | (2006.01) |
| *H01L 29/78* | (2006.01) |
| *H03K 17/567* | (2006.01) |

(52) U.S. Cl.
CPC ........ *H01L 29/063* (2013.01); *H01L 29/0696* (2013.01); *H01L 29/1095* (2013.01); *H01L 29/7397* (2013.01); *H01L 29/7813* (2013.01); *H03K 17/567* (2013.01)

(58) Field of Classification Search
None
See application file for complete search history.

(56) References Cited

U.S. PATENT DOCUMENTS

| | | | |
|---|---|---|---|
| 5,040,042 A | 8/1991 | Bauer et al. | |
| 9,525,029 B2 | 12/2016 | Sandow et al. | |
| 2010/0317158 A1* | 12/2010 | Yilmaz | B82Y 10/00 438/138 |

FOREIGN PATENT DOCUMENTS

DE           4343900        7/1995

\* cited by examiner

*Primary Examiner* — Cassandra Cox
(74) *Attorney, Agent, or Firm* — Dicke, Billig & Czaja, PLLC

(57) ABSTRACT

A power semiconductor device is disclosed. The device includes a semiconductor body coupled to a first load terminal structure and a second load terminal structure, a first cell and a second cell. A first mesa is included in the first cell, the first mesa including: a first port region and a first channel region. A second mesa included in the second cell, the second mesa including a second port region. A third cell is electrically connected to the second load terminal structure and electrically connected to a drift region. The third cell includes a third mesa comprising: a third port region, a third channel region, and a third control electrode.

22 Claims, 17 Drawing Sheets

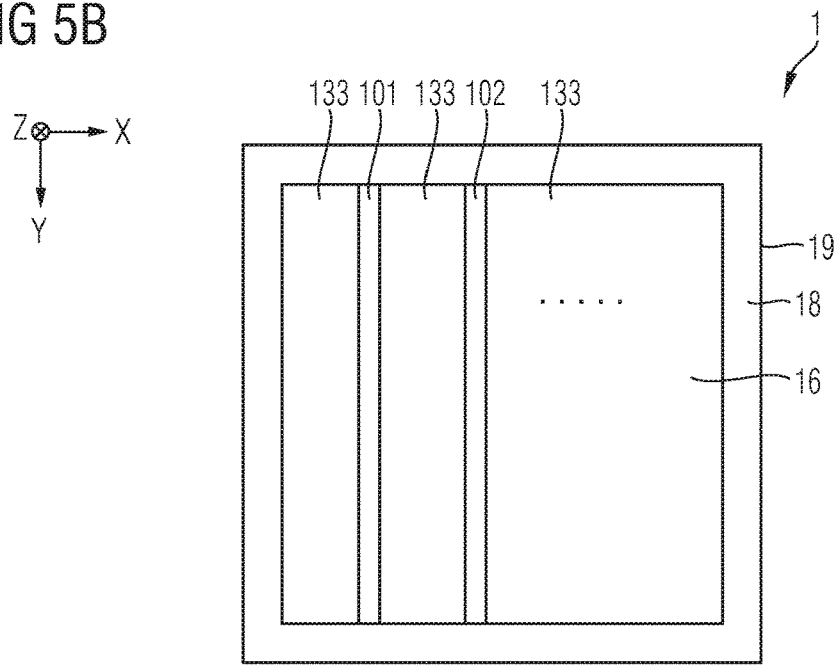
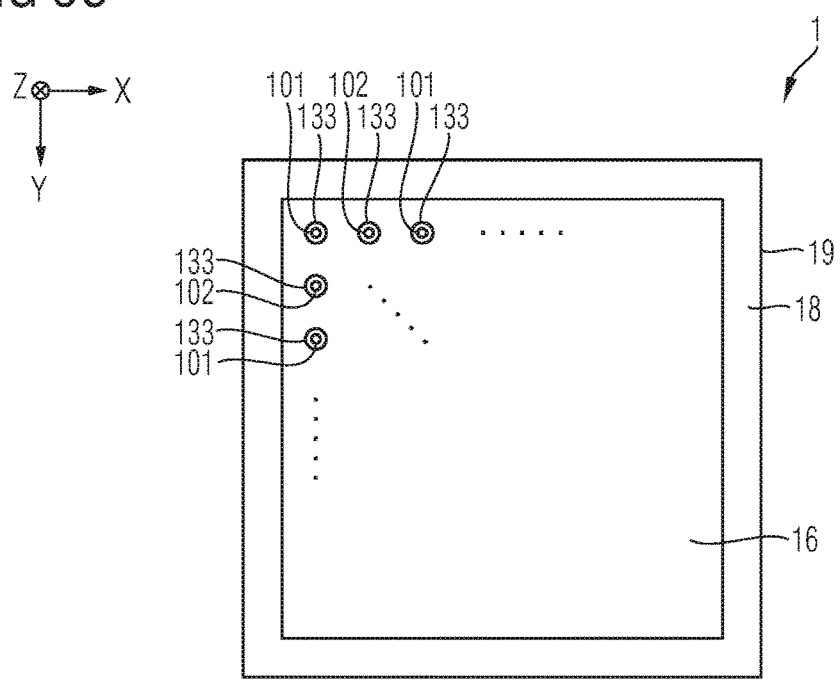

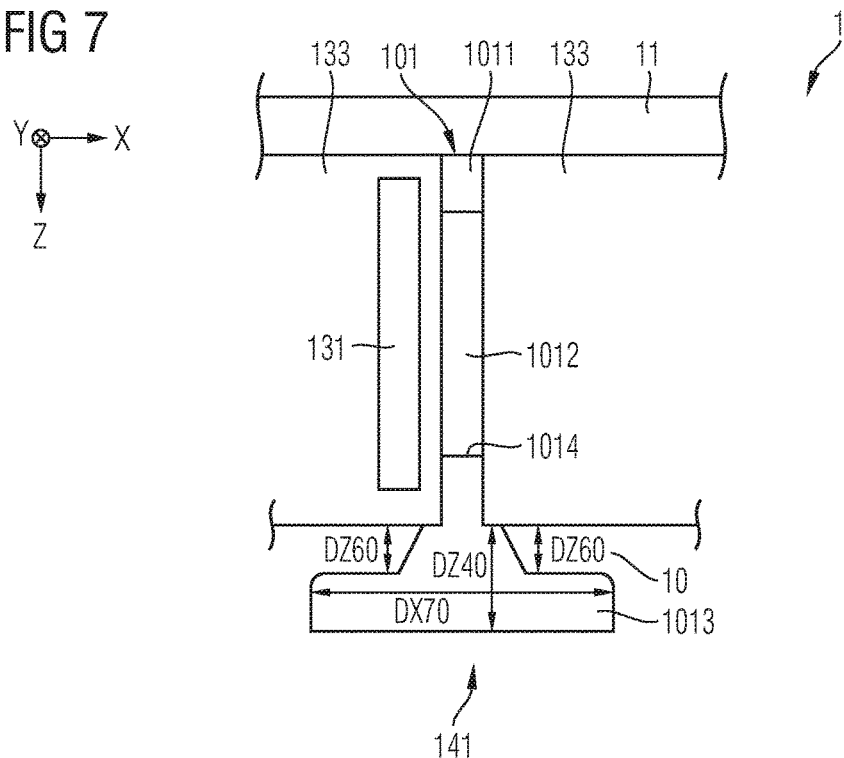
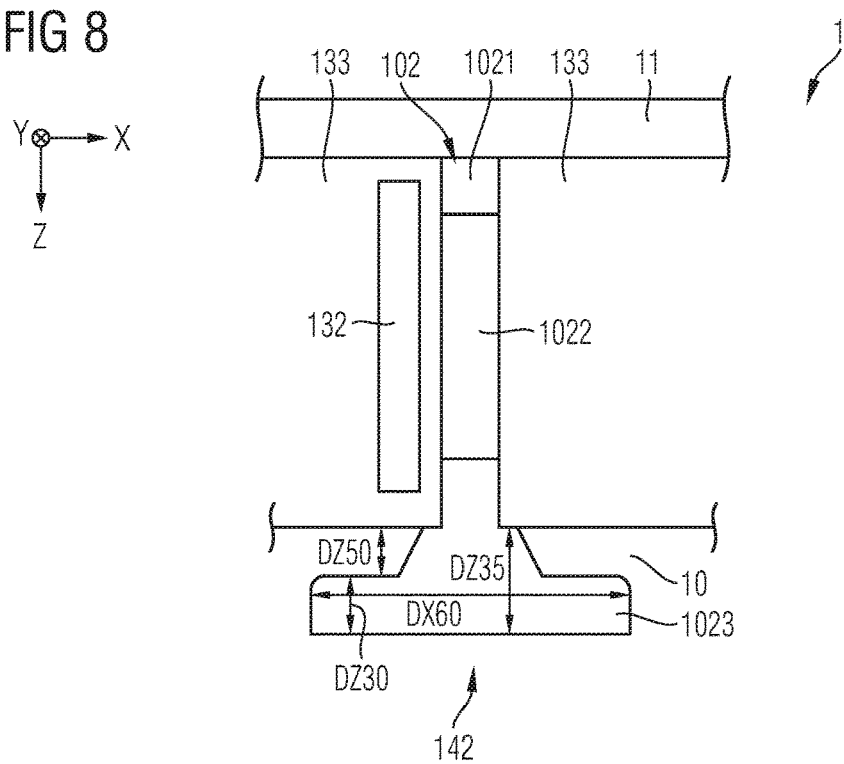

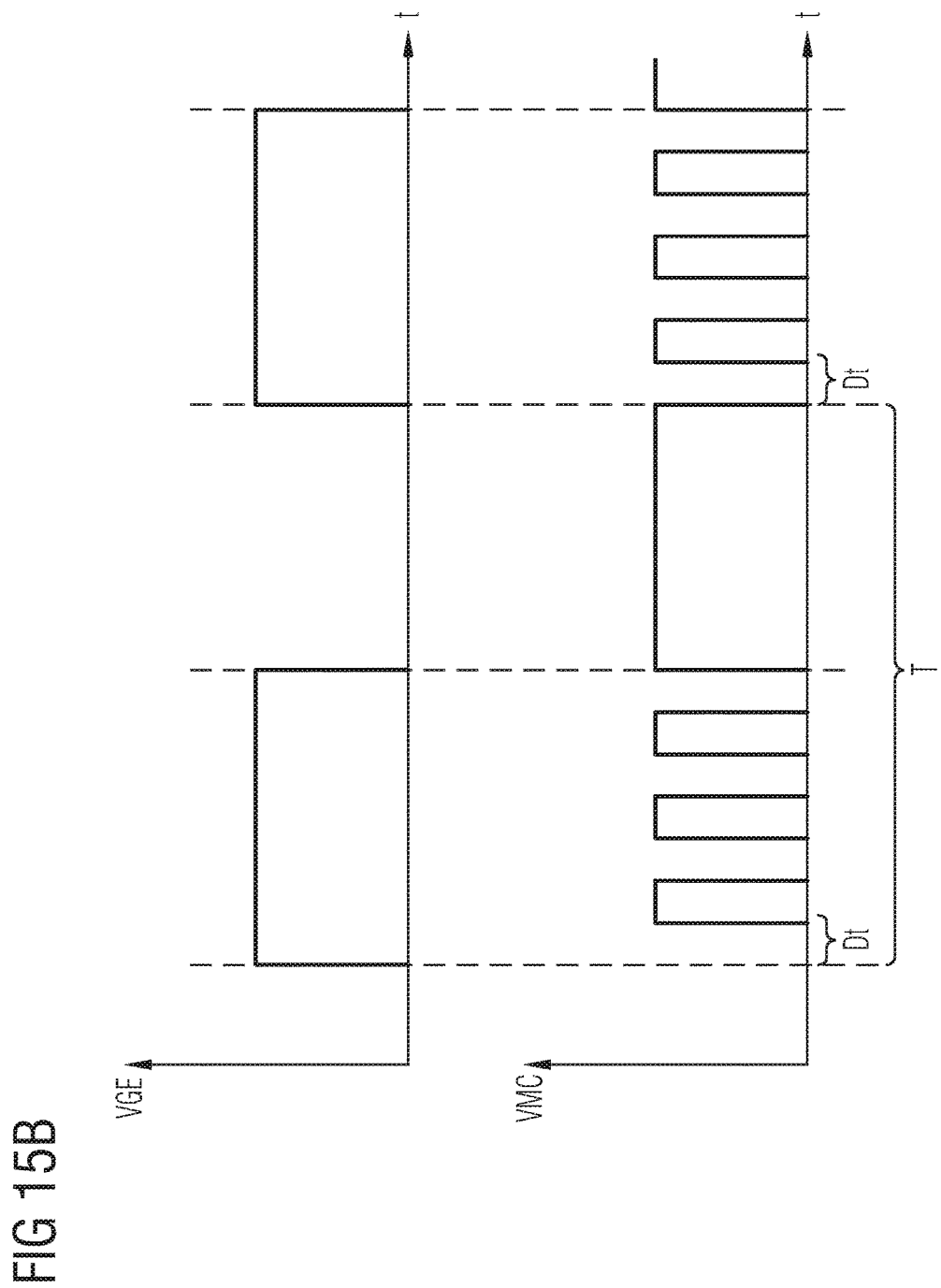

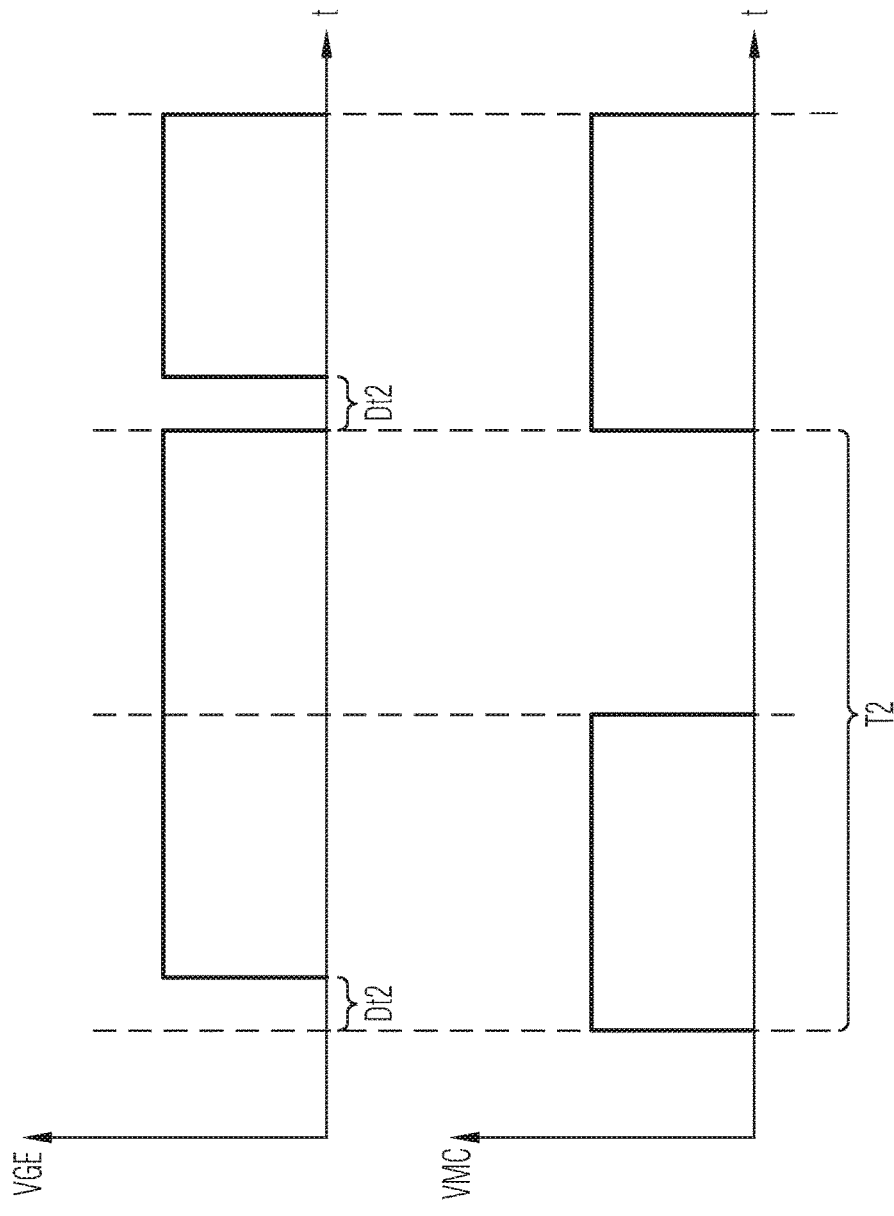

US 10,134,835 B2

POWER SEMICONDUCTOR DEVICE HAVING FULLY DEPLETED CHANNEL REGIONS

CROSS-REFERENCE TO RELATED APPLICATION

This Utility Patent application claims priority to German Patent Application No. 10 2016 112 019.7, filed Jun. 30, 2016 which is incorporated herein by reference.

TECHNICAL FIELD

This specification refers to embodiments of a power semiconductor device and to embodiments of a method of operating a power semiconductor device. In particular, this specification refers to embodiments of a power semiconductor device, e.g., an IGBT, having a channel region that is fully depletable of charge carriers of at least one conductivity type and to corresponding operating methods.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

It is a general aim to keep losses occurring at semiconductor devices low, wherein said losses essentially are caused by conducting losses and/or switching losses.

For example, a power semiconductor device comprises a plurality of MOS control heads, wherein each control head may have at least one control electrode and a source region and a channel region arranged adjacent thereto.

For setting the power semiconductor device into a conducting state, during which a load current in a forward direction may be conducted, the control electrode may be provided with a control signal having a voltage within a first range so as to induce a load current path within the channel region.

For setting the power semiconductor device into a blocking state, during which a forward voltage applied to load terminals of the semiconductor device may be blocked and flow of the load current in the forward direction is inhibited, the control electrode may be provided with the control signal having a voltage within a second range different from the first range so as to cut off the load current path in the channel region. Then, the forward voltage may induce a depletion region at a junction formed by a transition between the channel region and a drift region of the power semiconductor device, wherein the depletion region is also called "space charge region" and may mainly expand into the drift region of the semiconductor device. In this context, the channel region is frequently also referred to as a "body region", in which said load current path, e.g., an inversion channel, may be induced by the control signal to set the semiconductor device in the conducting state. Without the load current path in the channel region, the channel region may form a blocking junction with the drift region.

In the conducting state, a lower limit of a forward voltage drop may be determined by a forward biased diode of the power semiconductor device, such as at a transition between an n-doped drift region and a p-doped emitter region on the collector side of an IGBT. It may be desirable to overcome this limitation on the forward voltage in operation so as further minimize losses in the conducting state.

SUMMARY

According to an embodiment, a power semiconductor device comprises: a semiconductor body coupled to a first load terminal structure and a second load terminal structure and configured to conduct a load current; a first cell and a second cell, each being configured for controlling the load current and each being electrically connected to the first load terminal structure on the one side and electrically connected to a drift region of the semiconductor body on the other side, the drift region having a first conductivity type; a first mesa included in the first cell, the first mesa including: a first port region having the first conductivity type and being electrically connected to the first load terminal structure, and a first channel region being coupled to the drift region; a second mesa included in the second cell, the second mesa including: a second port region having the second conductivity type and being electrically connected to the first load terminal structure, and a second channel region being coupled to the drift region; each of the first mesa and the second mesa being spatially confined, in a direction perpendicular to a direction of the load current within the respective mesa, by a first insulation structure and exhibiting a total extension of less than 100 nm in said direction. The power semiconductor device further comprises a third cell being electrically connected to the second load terminal structure on the one side and electrically connected to the drift region on the other side. The third cell includes a third mesa comprising: a third port region having the first conductivity type and being electrically connected to the second load terminal structure; a third channel region being coupled to the drift region; and a third control electrode being insulated from the third mesa by a second insulation structure.

According to a further embodiment, a method of operating a power semiconductor device is presented, wherein the power semiconductor device comprises: a semiconductor body coupled to a first load terminal structure and a second load terminal structure and configured to conduct a load current; a first cell, a second cell, and a third cell each being configured for controlling the load current, wherein each of the first cell and the second cell are electrically connected to the first load terminal structure on the one side and electrically connected to a drift region of the semiconductor body on the other side, and wherein the third cell is electrically connected to the second load terminal structure on the one side and electrically connected to the drift region on the other side, the drift region having a first conductivity type; a first mesa included in the first cell, the first mesa including: a first port region having the first conductivity type and being electrically connected to the first load terminal structure, and a first channel region being coupled to the drift region; a second mesa included in the second cell, the second mesa including: a second port region having the second conductivity type and being electrically connected to the first load terminal structure, and a second channel region being coupled to the drift region; a third mesa included in the third cell, the third mesa including: a third port region having the first conductivity type and being electrically connected to the second load terminal structure, and a third channel region being coupled to the drift region. Each of the first mesa and the second mesa are spatially confined, in a direction perpendicular to a direction of the load current within the respective mesa, by the first insulation structure and exhibit a total extension of less than 100 nm in said direction. The power semiconductor device further comprises: at least one first control electrode configured to induce an inversion channel within the first channel region; and at least one third control electrode configured to induce an inversion channel within the third channel region. The method comprises: providing a first control signal to the at least one first control electrode so as to operate the power semiconductor device in a forward conducting state, in which the first control electrode induces the inversion channel within the first channel region; and in the forward conducting state, providing a third control signal to the at least one third control electrode so as to switch the power semiconductor device from a first forward conducting mode, in which the third control electrode does not induce the inversion channel within the third channel region, to a second forward conducting mode, in which the third control electrode induces the inversion channel within the third channel region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 5B-C each schematically illustrate sections of a horizontal projection of a power semiconductor device in accordance with one or more embodiments;

FIG. 7 schematically illustrates a section of a vertical cross-section of a power semiconductor device in accordance with one or more embodiments;

FIG. 8 schematically illustrates a section of a vertical cross-section of a power semiconductor device in accordance with one or more embodiments;

FIGS. 15A-B each schematically illustrate switching schemes of control signals in accordance with one or more embodiments; and FIGS. 16A-B each schematically illustrate switching schemes of control signals in accordance with one or more embodiments.

DETAILED DESCRIPTION

Figure 1A:
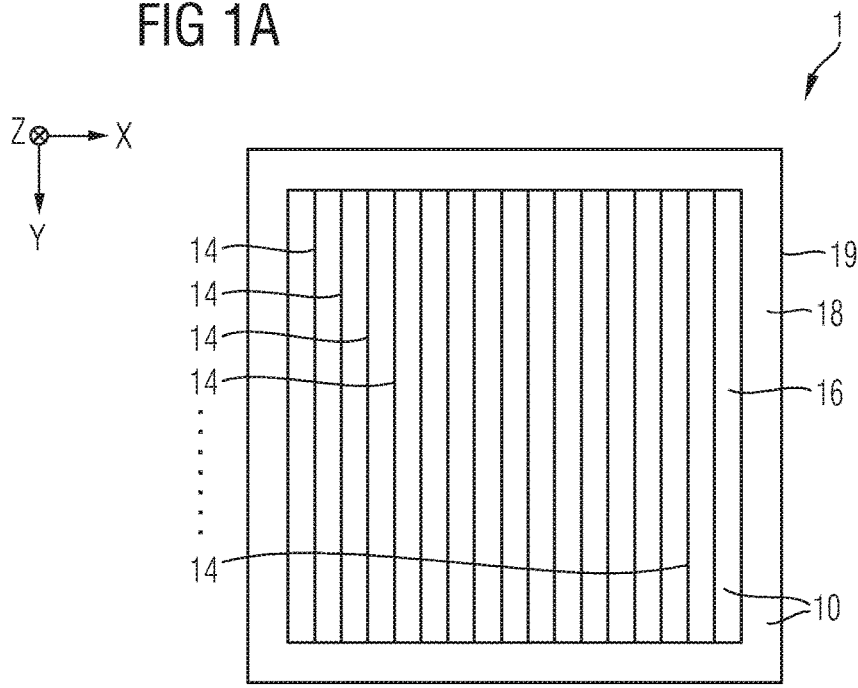
FIG. 1A-B each schematically illustrate sections of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification may describe an orientation substantially parallel to a horizontal surface of a semiconductor substrate or of a semiconductor region, such as the semiconductor body mentioned below. This can be for instance the surface of a semiconductor wafer or a die. For example, both the first lateral direction X and the second lateral direction Y mentioned below may be horizontal directions, wherein the first lateral direction X and the second lateral direction Y may be perpendicular to each other.

The term "vertical" as used in this specification may describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

However, it shall be understood that the embodiments of power semiconductor devices described below may exhibit a lateral configuration or a vertical configuration. In the first case, the extension direction Z may in fact be a lateral direction and not a vertical direction, and at least one of the first lateral direction X and the second lateral direction Y may in fact be a vertical direction.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

The term "power semiconductor device" as used in this specification intends to describe a semiconductor device on a single chip with high voltage blocking and/or high current-carrying capabilities. In other words, such power semiconductor device is configured for a high load current, typically in the Ampere range, e.g., up to several ten or hundred Ampere, and/or high voltages, typically above 5 V, or above 15 V or more typically 400V and, e.g., up to some 1000 Volts.

For example, the term "power semiconductor device" as used in this specification is not directed to logic semiconductor devices that are used for, e.g., storing data, computing data and/or other types of semiconductor based data processing.

Specific embodiments described in this specification thus pertain to, without being limited thereto, a power semiconductor device (in the following simply also referred to as "semiconductor device" or "device") that may be used within a power converter or a power supply, e.g., for converting a first power signal into a second power signal different from the first power signal. For example, to this end, the power semiconductor device may comprise one or more power semiconductor cells, such as a monolithically integrated transistor cell, a monolithically integrated diode cell, and/or a monolithically integrated IGBT cell, and/or a monolithically integrated MOS Gated Diode (MGD) cell, and/or a monolithically integrated MOSFET cell and/or derivatives thereof. Such diode cells and/or such transistor cells may be integrated in a semiconductor chip, wherein a number of such chips may be integrated in a power semiconductor module, such as an IGBT module.

Figure 1B:
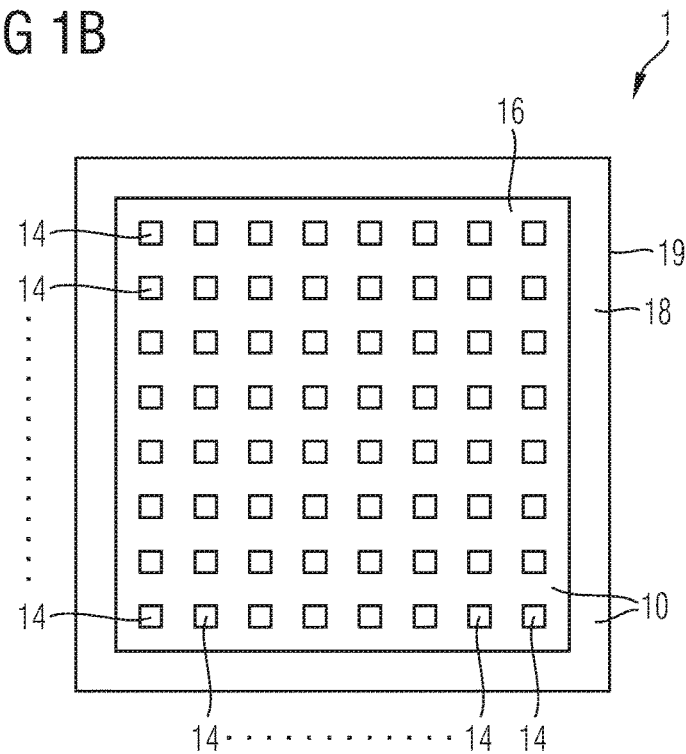

FIG. 1A schematically and exemplarily illustrates a section of a horizontal projection of a power semiconductor device 1 in accordance with one or more embodiments. Also FIG. 1B schematically and exemplarily illustrates a section of a horizontal projection of a power semiconductor device 1 in accordance with one or more other embodiments. In both of FIG. 1A and FIG. 1B, the horizontal projection may be in parallel to the plane defined by the first lateral direction X and the second lateral direction Y. The components of the semiconductor device 1 may each extend along the extension direction Z that may be perpendicular to each of the first lateral direction X and the second lateral direction Y.

The semiconductor device 1 may comprise an active cell field 16 that includes one or more active cells 14, e.g., MOS (Metal Oxide Semiconductor) cells, in the following simply referred to as "cells" 14. The number of cells 14 may be within the range of 100 to 100000, for example. The active cell field 16 may be configured to conduct a total load current, wherein the total load current may be greater than 1 A, greater than 10 A or even greater than 100 A. In the following, said total toad current is also simply referred to as "load current".

The active cell field 16 may be surrounded by an edge termination zone 18 of the semiconductor device 1. For example, the edge termination zone 18 does not include any active cells. The edge termination zone 18 may be terminated by an edge 19, which may have come into being, e.g., by dicing a chip out of a wafer.

Further, the active cell field 16 or, respectively, the active cell field 16 and the edge termination zone 18 may be configured to block a voltage of at least 20 V, of at least 100 V, of at least 400 V or of at least 1000 V.

As schematically illustrated in FIG. 1A, the cells 14 may exhibit a stripe configuration. Accordingly, each of the cells 14 and the components they may comprise may extend along substantially the entire active cell field 16 along one of the first lateral direction X and the second lateral direction Y (as illustrated), e.g., bordering a transition region between the active cell field 16 and the edge termination zone 18. For example, the total lateral extension of a respective (stripe) cell amounts to less than 30%, less than 5%, or even less than 1% of the total extension of the active cell field 16 along one of the first lateral direction X and the second lateral direction Y.

In another embodiment that is schematically illustrated in FIG. 1B, the cells 14 may exhibit a needle configuration whose total lateral extensions along each of the first lateral direction X and the second lateral direction Y amount to only a fraction of the total lateral extensions along the first lateral direction X and the second lateral direction Y of the active cell field 16. For example, the total lateral extension of a respective needle cell amounts to less than 30%, less than 5%, or even less than 1% of the total extension of the active cell field 16 along one of the first lateral direction X and the second lateral direction Y. Further optional aspects of a needle cell and a stripe cell will be explained further below.

In another embodiment, the active cell field 16 may comprise both types of cells 14, e.g., one or more cells 14 in a stripe configuration and one or more cells 14 in a needle configuration.

Both the active cell field 16 and the edge termination zone 18 may at least partially be formed within a joint semiconductor body 10 of the device 1. The semiconductor body 10 may be configured to carry the total load current that may be controlled, e.g., by means of the cells 14, as will be explained in more detail below.

In an embodiment, the semiconductor device 1 is a bipolar power semiconductor device 1. Thus, the total load current within the semiconductor body 10 may be constituted by a first load current formed by first charge carriers of a first conductivity type and by a second load current formed by second charge carriers of a second conductivity type complimentary to the first conductivity type. For example, the first charge carriers are electrons and the second charge carriers are holes.

Figure 2A:
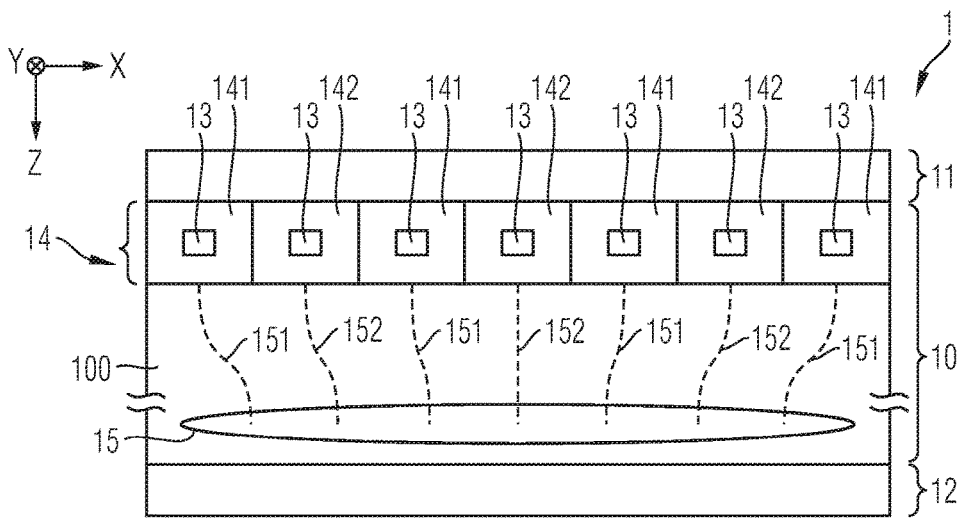
FIG. 2A-B each schematically illustrate a section of a vertical cross-section of a power semiconductor device in accordance with one or more embodiments.

Regarding now FIG. 2A, which schematically and exemplarily illustrates a section of a vertical cross-section of the semiconductor device 1 in accordance with one or more embodiments, the semiconductor device 1 may further comprise a first load terminal structure 11 and a second load terminal structure 12. For example, the first load terminal structure 11 is arranged separately from the second load terminal structure 12. The semiconductor body 10 may be coupled to each of the first load terminal structure 11 and the second load terminal structure 12 and may be configured to receive the total load current 15 (also referred to as "load current") via the first load terminal structure 11 and to output the total load current 15 via the second load terminal structure 12 and/or vice versa.

The semiconductor device 1 may exhibit a vertical set-up, according to which, for example, the first load terminal structure 11 is arranged on a frontside of the semiconductor device 1 and the second load terminal structure 12 is arranged on a backside of the semiconductor device 1. In another embodiment, the semiconductor device 1 may exhibit a lateral set-up, according to which, e.g., each of the first load terminal structure 11 and the second load terminal structure 12 are arranged on the same side of the semiconductor device 1.

For example, the first load terminal structure 11 comprises a first metallization, e.g., a frontside metallization, and the second load terminal structure 12 may comprise a second metallization, e.g., a backside metallization. Further, one or both of the first load terminal structure 11 and the second load terminal structure 12 may comprise a diffusion barrier.

Within the present specification, the direction of the total load current 15 is expressed in the conventional manner, i.e. as a flow direction of positive charge carriers such as holes and/or as direction opposite to a flow of negative charge carriers such as electrons. A forward direction of the total load current 15 may point, for example, from the second load terminal structure 12 to the first load terminal structure 11.

As has been explained above, the total load current 15 may comprise a first load current 151 of the first conductivity type, e.g., an electron current, and a second load current 152 of the second conductivity type, e.g., a hole current. Thus, the direction of the second load current 152 may be in parallel to the technical (conventional) direction of the total load current 15, whereas the direction of the first load current 151 may be in anti-parallel to the direction of the load current 15. The sum of amounts of the first load current 151 and the second load current 152 may form the total load current 15 conducted by the semiconductor body 10.

Figure 2B:
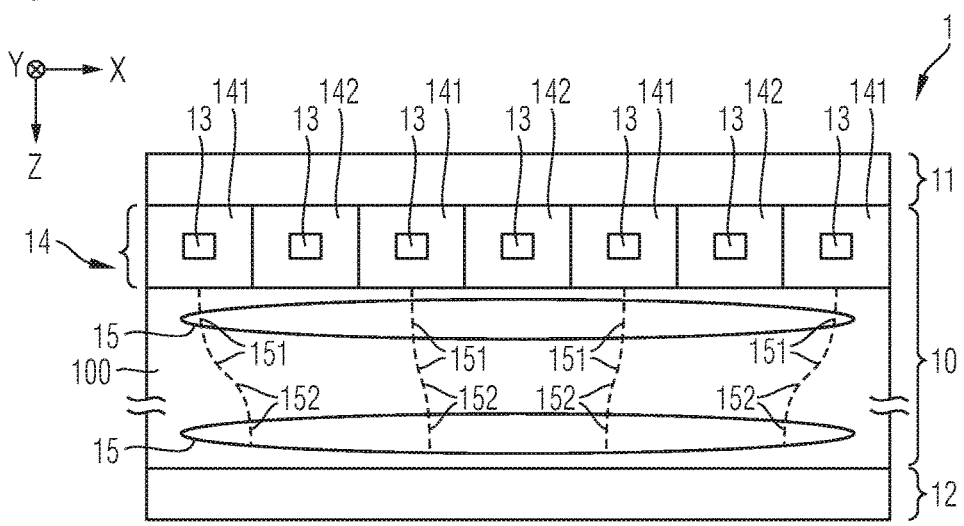

A first charge carrier of the first conductivity type, e.g., an electron, moving from the first load terminal structure 11 towards the second load terminal structure 12 or vice versa may recombine with a second charge carrier of the complementary type, e.g., of the second conductivity type, e.g., a hole, on its way through the semiconductor body 10. For example, as illustrated in FIGS. 2B and 3B, in the vicinity of the first load terminal structure 11, the total load current 15 in the forward direction may largely or even entirely consist of the first load current 151 of electrons moving towards the second load terminal structure 12, wherein, in the vicinity of the second load terminal structure 12, the total load current 15 in the forward direction may mostly or even entirely consist of a second load current 152 of holes moving towards the first load terminal structure 11. The electrons and holes may recombine inside the semiconductor body 10. However, within a drift region 100 of the semiconductor body 10, there occurs substantially no or only little recombination, according to one or more embodiments. According to an embodiment, an ambipolar lifetime of the first and second charge carrier type, i. e., the time until the density of carriers is reduced to a value of $1/e \approx 37\%$ of their initial value, is more than e. g., 1 µs, more than 10 µs, more than 30 µs or more than 70 µs.

Further, the first load current 151 may be made up of a first drift current, e.g., an electron drift current, and a first diffusion current, e.g., an electron diffusion current. Also, the second load current 152 may be made up of a second drift current, e.g., a hole drift current, and second diffusion current, e.g., a hole diffusion current.

Thus, in the conducting state of the semiconductor device 1, the total load current 15 can be conducted by the semiconductor body 10, wherein at each cross-section through the semiconductor body 10 separating the first load contact structure 11 from the second load contact structure 12, the total load current 15 can be composed of the first load current 151 flowing through said cross-section, which may be an electron current, and the second load current 152 flowing through said cross-section, which may be a hole current. At each cross-section, the sum of amounts of the first load current 151 and the second load current 152 may equal the amount of the total load current 15, wherein said cross-sections may be perpendicular to the direction of the total load current 15. For example, during the conducting state, the total load current 15 may be dominated by the first load current 151, i.e., the first load current 151 may be substantially greater than the second load current 152, e.g., amounting to more than 75%, more than 80%, or even more than 90% of the total load current 15. During a transition from the blocking state to the conducting state or during a transition from the conducting state to the blocking state, i.e., during switching, the second load current 152 may represent a higher portion of the total load current 15, i.e., the second load current 152 may be even greater than the first load current 151.

For controlling the total load current 15, the semiconductor device 1 may further comprise a control terminal structure 13. For example, the semiconductor device 1 may be configured to be set into one of the blocking state and the conducting state by means of the control terminal structure 13.

In an embodiment, for setting the semiconductor device 1 into a conducting state during which the total load current 15 in the forward direction may be conducted, the control terminal structure 13 may be provided with a control signal having a voltage within a first range. For setting the semiconductor device 1 into a blocking state during which a forward voltage may be blocked and flow of the load current 15 in the forward direction is avoided, the control terminal structure 13 may be provided with the control signal having a voltage within a second range different from the first range.

In an embodiment, the control signal may be provided by applying a voltage between the control terminal structure 13 and the first load terminal structure 11 and/or by applying a voltage between the control terminal structure 13 and the second load terminal structure 12.

For example, the control terminal structure 13 may at least partially be implemented within the cells 14, as schematically illustrated in FIGS. 2A-3B. Further, the cells 14 may at least partially be implemented within the semiconductor body 10. In other words, the cells 14 may form a part of the semiconductor body 10.

In an embodiment, the cells 14 may comprise at least one first cell 141 and at least one second cell 142. The second cell 142 may be different and arranged separately from the first cell 141.

Each of the first cell 141 and the second cell 142 may be electrically connected to the first load terminal structure 11 on one side and to the semiconductor drift region 100 (herein also simply referred to as "drift region") of the semiconductor body 10 on another side. Thus, in an embodiment, each of the first cell 141 and the second cell 142 may form an interface between the drift region 100 of the semiconductor body 10 on the one side and the first load terminal structure 11 on the other side. Further, in regions of the semiconductor device 1 where there are no cells 14, e.g., in said edge termination zone 18, the semiconductor body 10, e.g., the drift region 100, may be electrically insulated from the first load terminal structure 11.

The drift region 100 may have the first conductivity type. For example, the drift region 100 exhibits a concentration of dopants of the first and/or of the second conductivity type within the range of $10^{12}$ cm$^{-3}$ to $10^{18}$ cm$^{-3}$, e.g., $10^{13}$ cm$^{-3}$ to $10^{15}$ cm$^{-3}$, e.g., within in the range of $2*10^{13}$ cm$^{-3}$ to $2*10^{14}$ cm$^{-3}$. For example, the comparatively high dopant concentrations may be applicable if the semiconductor device 1 exhibits a compensation structure (also referred to as superjunction structure). In this case, locally high concentrations of dopants of the first and the second conductivity type may occur. However, when integrating the first and second doping concentrations in the drift region 100 in a plane, the resulting integrated dopant concentration can be significantly lower, at least e. g., by a factor of 3, or a factor of 5, or a factor of 10 than the larger of the individual dopant concentration of the first and/or second conductivity type. Such locally high dopant concentration may be supportive for draining charge carriers out of the semiconductor body 10, e.g., during turn-off, and may thus lead to reduced turn-off losses and/or faster turn-off.

In an embodiment, the first cell 141 is configured to control the first load current 151 and the second cell 142 is configured to control the second load current 152. For example, the first cell 141 is configured to prevent the second load current 152 from traversing the first cell 141. Further, the second cell 142 can also be configured to prevent the second load current 152 from traversing the second cell 152, e.g., if the semiconductor device 1 is in a conducting state.

The first cell 141 may thus be a unipolar cell configured to control charge carriers of the first conductivity type and the second cell 142 may be a unipolar cell configured to control charge carriers of the second conductivity type.

In an embodiment, the semiconductor device 1 may be configured to split the total load current 15 conducted by the semiconductor body 10 into the first load current 151 and into the second load current 152 by means of the first cell 141 and the second cell 142 that may form an interface between the first load terminal structure 11 and a part of the semiconductor body 10, e.g., said drift region 100. Thus, in the path of the total load current 15 between the drift region 100 of the semiconductor body 10 and the first load terminal structure 11, the first load current 151 may traverse the first cell 141, e.g., if the semiconductor device 1 is in a conducting state, and, e.g., if the semiconductor device 1 is switched from the conducting state to the blocking state, the second load current 152 may traverse the second cell 142, as will be explained in more detail below.

Figure 3A:
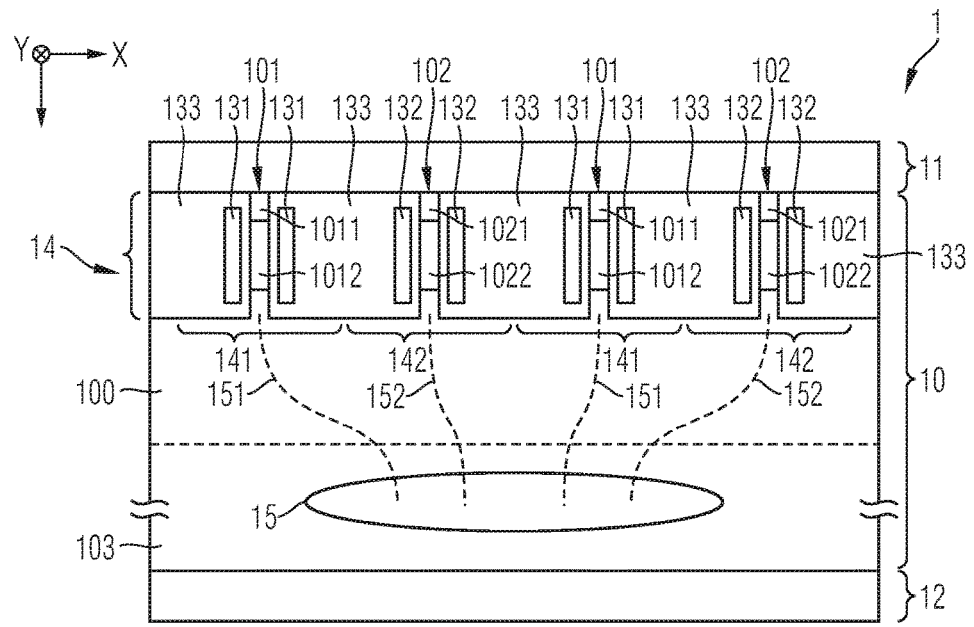
FIG. 3A-B each schematically illustrate a section of a vertical cross-section of a power semiconductor device in accordance with one or more embodiments.
Figure 3B:
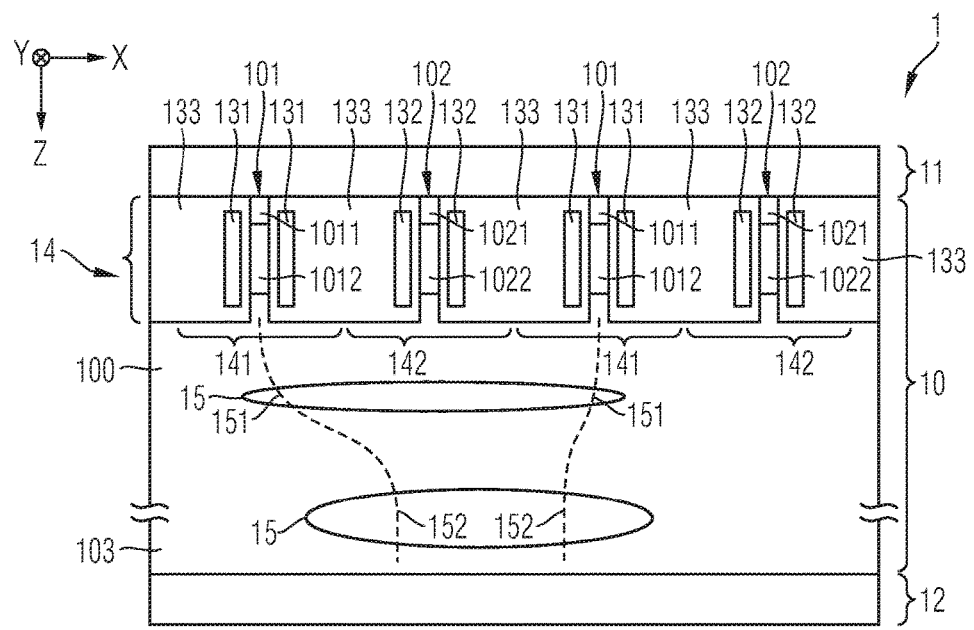

With respect to FIGS. 3A and 3B, exemplary aspects of the cells 14 shall be explained.

FIGS. 3A and 3B schematically and exemplarily illustrate sections of a vertical cross-section of the semiconductor device 1 in accordance with one or more embodiments. The general configuration of the semiconductor device 1 in accordance with the embodiment of FIGS. 3A-B may be identical or similar to the general configuration of the semiconductor device 1 in accordance with the embodiments of FIGS. 1A, 1B and 2A, 2B. Thus, what has been stated above with respect to FIGS. 1A to 2B may equally apply to the embodiment of FIGS. 3A and 3B, if not stated otherwise.

In an embodiment, the control signal provided to the control terminal structure 13 comprises a first control signal and a second control signal. The first control signal may be provided for controlling the first cell 141 and the second control signal may be provided for controlling the second cell 142. In an embodiment, the first control signal is identical to the second control signal. In another embodiment, the first control signal is different from second control signal. The control signal may be provided from external of the semiconductor device 1, e.g., by a driver (not illustrated) configured to generate the first control signal and the second control signal. In another embodiment, one or both of the first control signal and second control signal may be generated or provided by an internal signal or by an internal potential of the semiconductor device 1.

Further, the control terminal structure 13 may comprise one or more first control electrodes 131 and/or one or more second control electrodes 132.

The first cell 141 may comprise one or more of the first control electrodes 131 that can be configured to receive the first control signal. The first control electrodes 131 may be insulated from the semiconductor body 10 by means of an insulation structure 133.

The second cell 142 may comprise one or more of the second control electrodes 132 that can be configured to receive the second control signal. The second control electrodes 132 may also be insulated from the semiconductor body 10 by means of the insulation structure 133.

The material and the dimensions of the one or more first control electrodes 131 may be identical to the material and the dimensions of the one or more second control electrodes 132 or different therefrom.

Further, already at this point, it shall be understood that in contrast to the exemplary schematic representations in FIGS. 3A, 3B, 5A and 6, the control electrodes 131 and 132 may also be arranged in contact with each other in accordance with one or more embodiments, thereby forming a monolithic control electrode used for controlling each of the first cell 141 and the second cell 142. In other words, in an embodiment, the control electrodes 131 and 132 can be respective sections of one joint control electrode.

The insulation structure 133 may thus house each of the first control electrode(s) 131 and the second control electrode(s) 132. Further, one, more or each of the first control electrode(s) 131 and the second control electrode(s) 132 may be electrically insulated from the first load terminal structure 11.

In an embodiment, the first cell 141 includes a first mesa 101 at least partially implemented as a part of the semiconductor body 10. Also, the second cell 142 may include a second mesa 102 that is at least partially implemented as a part of the semiconductor body 10. For example, each of the first mesa 101 and the second mesa 102 is electrically connected to the first load terminal structure 11. The second mesa 102 can be different and arranged separately from the first mesa 101.

The first mesa 101 and the second mesa 102 may be spatially confined by the insulation structure 133. Exemplary specifications of the spatial dimensions of the mesa 101 and 102 and their components will be disclosed with respect to FIG. 5. At the same time, the insulation structure 133 may house the first control electrode(s) 131 and the second control electrode(s) 132.

The first mesa 101 may include a first port region 1011 electrically connected to the first load terminal structure 11. The first port region 1011 may be a first semiconductor port region. For example, the first port region 1011 has the first conductivity type, e.g., at a dopant concentration in the range of $10^{19}$ cm$^{-3}$ to $10^{22}$ cm$^{-3}$, e.g., $10^{20}$ cm$^{-3}$ to $5*10^{21}$ cm$^{-3}$. For example, the first port region 1011 is an n$^+$-region. Thus, a dopant concentration of the first port region 1011 may be at least two orders of magnitude (corresponding to a factor of 100) greater than the dopant concentration of the drift region 100. In an embodiment, the first port region 1011 is a doped semiconductor region that has additionally been silicided. For example, a silicide is provided in the first port region 1011. Further, such silicided first port region 1011 may exhibit a common extension range along the extension direction Z with the first control electrode 131. For example, such silicided first port region 1011 could also be referred to as "metal source". At a transition from the silicided first port region 1011 to a first channel region 1012 (explained in more detail below) of the first mesa 101, a doping spike may be present, e.g., an n$^+$-doping spike.

Also, the second mesa 102 may include a second port region 1021 electrically connected to the first load terminal structure 11. The second port region 1021 may be a second semiconductor port region. For example, the second port region 1021 has the second conductivity type, e.g., at a dopant concentration in the range of $10^{18}$ cm$^{-3}$ to $10^{22}$ cm$^{-3}$, e.g., $10^{19}$ cm$^{-3}$ to $10^{21}$ cm$^{-3}$. For example, the second port region 1021 is a p$^+$-region. Thus, a dopant concentration of the second port region 1021 may be at least two orders of magnitude greater than the dopant concentration of the drift region 100. In an embodiment, the second port region 1021 is a doped semiconductor region that has additionally been silicided. For example, a silicide is provided in the second port region 1021. Further, such silicided second port region 1021 may exhibit a common extension range along the extension direction Z with the second control electrode 132. At a transition from the silicided second port region 1021 to a second channel region 1022 (explained in more detail below) of the second mesa 102, a doping spike may be present, e.g., a p$^+$-doping spike.

The first mesa 101 may further include a first channel region 1012 in contact with the first port region 1011. The first channel region 1012 may be a first semiconductor channel region. For example, the first channel region 1012 has the second conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the first channel region 1012 is a p-region or a p$^-$-region. In another embodiment, the first channel region 1012 has the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$.

For example, the first channel region 1012 may further be coupled to the semiconductor drift region 100, e.g., it may be in contact with the drift region 100 or may be coupled thereto by means of a plateau region (not illustrated in FIGS. 2A-3B) elucidated in more detail below.

In an embodiment, the first channel region 1012 may isolate the first port region 1011 from the semiconductor drift region 100. Further, the first channel region 1012 may be an electrically floating region. For example, the first channel region 1012 is not in contact with the first load terminal structure 11 but separated therefrom by means of the first port region 1011.

The second mesa 102 may further include a second channel region 1022 in contact with the second port region 1021. The second channel region 1022 may be a second semiconductor channel region. For example, the second channel region 1022 has the second conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the second channel region 1022 is a p-region. In another embodiment, the second channel region 1022 has the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$.

For example, the second channel region 1022 may further be coupled to the semiconductor drift region 100, e.g., it may be in contact with the drift region 100 or may be coupled thereto by means of another plateau region (not illustrated in FIGS. 2A-3B) elucidated in more detail below.

Further, the second channel region 1022 may isolate the second port region 1021 from the semiconductor drift region 100. Further, the second channel region 1022 may be an electrically floating region. For example, the second channel region 1022 is not in contact with the first load terminal structure 11 but separated therefrom by means of the second port region 1021. In another example, the second channel region 1022 may be of the same conductivity type as the second port region 1021 and the second channel region 1022 is only temporarily rendered into an insulating or floating state by applying a suitable work function of the material of the second control electrode 132 or a suitable electrical potential to the second control electrode 132.

Thus, in contrast to a conventional IGBT configuration, in an embodiment of the power semiconductor device 1, at least the first channel region 1012 is not electrically connected to the first load terminal structure 11 within the active cell field 16, but electrically floating. For example, the first mesa 101 is coupled to the first load terminal structure exclusively by means of the first port region 1011. Additionally or alternatively, the second channel region 1022 is not electrically connected to the first load terminal structure 11 within the active cell field 16, but electrically floating. For example, the second mesa 102 is coupled to the first load terminal structure exclusively by means of the second port region 1021.

The first mesa 101 can be a first semiconductor mesa and the second mesa 102 can be a second semiconductor mesa. In another embodiment, one or each of the first port region 1011 and the second port region 1022 may comprise a metal.

For example, the first port region 1011 amounts to a certain portion of the total volume of the first mesa 101, e.g., within the range of up to 75%, e.g., 10% to 75%, e.g., in the range of 20% to 50%. The first channel region 1012 may amount to another portion of the total volume of the first mesa 101, e.g., within the range of 10% to 90%, e.g., 25% to 90%, e.g., in the range of 25% to 75%.

The second port region 1021 may amount to a certain portion of the total volume of the second mesa 102, e.g., within the range of up to 75%, e.g., 10% to 75%, e.g., in the range of 20% to 50%. The second channel region 1022 may amount to another portion of the total volume of the second mesa 102, e.g., within the range of 10% to 90%, e.g., 25% to 90%, e.g., in the range of 25% to 75%.

In an embodiment, the first cell 141 including the first mesa 101 is configured to fully deplete the first channel region 1012 of mobile charge carriers of the second conductivity type in the conducting state of the semiconductor device 1.

Further, the second cell 142 including the second mesa 102 may be configured to fully deplete the second channel region 1022 of mobile charge carriers of the second conductivity type in the conducting state of the semiconductor device 1.

In the conducting state, as exemplarily illustrated in FIG. 3B, the semiconductor device 1 may be configured to split the path of total load current 15 into at least two separate paths, the first one of which is taken by the first load current 151 and traversing the first mesa 101 including the first channel region 1012 that is fully depleted of mobile charge carriers of the second conductivity type, and the second one of which is taken by the second load current 152 and does neither traverse the second mesa 102 including the second channel region 1022 that may be fully depleted of mobile charge carriers of the second conductivity type nor the first mesa 101 including the first channel region 1012 that may also be fully depleted of mobile charge carriers of the second conductivity type. Rather, the second cell 142 may be configured to block flow of the second load current 152 through the second mesa 102, thereby avoiding that mobile charge carriers of the second conductivity type leave the semiconductor body 10 during the conducting state of the semiconductor device 1. In other words, during the conducting state, the magnitude of the second load current 152 within each of the first mesa 101 and the second mesa 102 according to one embodiment may amount to substantially zero. According to another embodiment, a certain portion of the load current of up to 30% or up to 20% or up to 10% may be conducted by the second load current 152 which may traverse at least one of the first mesa 101 and second mesa 102.

In the following, the term "fully depleted channel region" intends to describe a channel region that is fully depleted of mobile charge carriers of the second conductivity type, wherein mobile charge carriers of the first conductivity type may still be present to a substantial extent in the fully depleted channel region. The same definition applies to the term "fully depletable channel region".

For example, the fully depleted first channel region 1012 does not include any mobile charge carriers of the second conductivity type or at least no mobile charge carrier density of the second conductivity type above a leakage current level. Further, in an embodiment, the fully depleted second channel region 1022 does not include any mobile charge carriers of the second conductivity type or at least no mobile charge carrier density of the second conductivity type above a leakage current level.

Thus, in accordance with an embodiment, the channel regions 1012 and 1022 are fully depleted regions in a conducting state of the semiconductor device 1.

For example, the channel regions 1012 and 1022 are fully depleted. This can be achieved by, e.g., choosing materials for the control electrodes 131 and 132 resulting in work functions of the control electrodes 131, 132 which may differ from those of the channel regions 1012 and/or 1022. Additionally or alternatively, this can be achieved by setting the control electrodes 131 and 132 to an appropriate electrical potential with respect to, e.g., the electrical potential of the first load terminal structure 11. Thus, in an embodiment, full depletion of the channel regions 1012, 1022 can be achieved due to a difference between the work function(s) of one or both of the control electrodes 131, 132 on the side and the work functions(s) of one or both of the channel regions 1012, 1022 on the other side and due to setting one or both of the control electrodes 131, 132 to a defined electrical potential.

For example, if the semiconductor device 1 is set into the conducting state, e.g., by applying a voltage within said first range between each of the control electrodes 131 and 132 on the one side and the first load terminal structure 11 on the other side (e.g., the electrical potential of each of the control electrodes 131 and 132 can be greater than the electrical potential of the first load terminal structure 11), the channel regions 1012 and 1022 may become fully depleted of mobile charge carriers of the second conductivity type. In the first channel region 1012, there may then be significantly less mobile charge carriers of the second conductivity type, e.g., holes as compared to a state wherein no positive voltage is applied. And, in the second channel region 1022, there may then also be significantly less mobile charge carriers of the second conductivity type, e.g., holes. For example, the formulation "significantly less mobile charge carriers" intends to describe, in this specification, that the amount of mobile charge carriers of the respective conductivity type is less than 10% of the mobile charge carriers of the other conductivity type.

In accordance with an embodiment, the semiconductor device 1 is configured to fully deplete the first channel region 1012 of charge carriers of the second conductivity type if a voltage applied between the first control electrode 131 and the first load terminal structure 11 is within said first range, e.g., within a range of −3 V to +3 V. According to another embodiment, the semiconductor device 1 is configured to fully deplete the first channel region 1012 if an electric field applied between the first control electrode 131 and the first load terminal structure 11 is within a first range, e.g., within a range of −10 MV/cm to +10 MV/cm or within a range of −6 MV/cm to +6 MV/cm or within a range of −4 MV/cm to +4 MV/cm. The same may apply analogously to the second channel region 1022.

For example, in a blocking state of the semiconductor device 1, only a current path for the second load current 152 exists in at least one of the channel regions 1012 and 1022, e.g., only in the channel region 1022, thus allowing an eventual leakage current to pass. As described above, a forward voltage applied between the load terminal structures 11 and 12 of the semiconductor device 1 may induce a space charge region at a junction formed at a transition to the drift region 100.

For switching the semiconductor device 1 from the conducting state to the blocking state, a voltage within a second range different from the first range may be applied between the first control electrode 131 and the first load terminal structure 11 so as to cut off the load current path in the first channel region 1012. For example, the second range may range from 0 V to a particular negative voltage value in case the load current path in the first channel region 1012 to be cut off is an electron current path. Accordingly, the second range may range from 0 V to a particular positive voltage value in case the load current path in the first channel region 1012 to be cut off is a hole current path. The same voltage or another voltage in the second range or yet another voltage may also be applied between the second control electrode 132 and the first load terminal structure 11. Then, an accumulation channel of mobile charge carriers of the second conductivity type may be induced in the second channel region 1022. Further, in an embodiment the second channel region 1022 is not depleted, but forms a conductive connection towards the first load terminal structure 11 due to dopants of the second conductivity type. For example, the accumulation channel may facilitate movement of the second charge carriers of the second conductivity type out of the semiconductor body 10 to the first load terminal structure 11. This may contribute to a fast reduction of the total charge carrier concentration in the semiconductor body 10 during switch-off of the semiconductor device 1.

For switching the semiconductor device 1 from the blocking state to the conducting state, a voltage within the first range may be applied between the first control electrode 131 and the first load terminal structure 11, as described above. A current path for mobile charge carriers of the first conductivity type may then be induced in the first channel region 1012, e.g., by formation of an inversion channel. The inversion channel may extend over the whole first channel region 1012 along the extension direction Z. In a variant, the inversion channel may extend over the whole first channel region 1012 also along the first lateral direction X and/or the second lateral direction Y. At the same time, the first channel region 1012 may become fully depleted of mobile charge carriers of the second conductivity type due to said voltage being within said first range such that a flow of mobile charge carriers of the second conductivity through the first channel region 1012 between the semiconductor body 10 and the first load terminal structure 11 is inhibited. The same voltage or another voltage in the first range or yet another voltage may further be applied between the second control electrode 132 and the first load terminal structure 11. The second channel region 1022 may then become fully depleted of mobile charge carriers of the second conductivity type such that a flow of mobile charge carriers of the second conductivity through the second channel region 1022 between the semiconductor body 10 and the first load terminal structure 11 is reduced or inhibited.

The semiconductor body 10 may further comprise a further port region 103 electrically connected to the second load terminal structure 12 and coupled to the drift region 100. The further port region 103 may be a further semiconductor port region. For example, the further port region 103 comprises a first emitter having the second conductivity type and/or a second emitter having the first conductivity type, e.g., so-called n-shorts (in case the first conductivity type is n), in order to implement a reverse conductivity of the semiconductor device 1. Further, the further port region 103 may comprise a buffer region, also known as field stop region, which may include, e.g., dopants of the same conductivity type as the drift region 100, e.g., of the first conductivity type, but a higher dopant concentration as compared to the dopant concentration of the drift region 100. However, since these exemplarily configurations of the further port region 103 are generally known to the skilled person, the first emitter, the second emitter and the buffer region are neither illustrated in FIG. 3 nor explained herein in more detail. In addition, it shall be understood that certain aspects of the present disclosure are related to embodiments of a specific configuration of the section of the semiconductor body 10 in proximity to the second load terminal 12.

As has been explained above, the semiconductor body 10 can be configured to conduct the total load current 15 in the forward direction between said load terminal structures 11 and 12. To this end, the first control electrode 131 may be configured to induce, in response to receiving said first control signal, an inversion channel for conducting the first load current 151 within the first channel region 1012. For example, in response to receiving the first control signal, the semiconductor device 1 can be configured to fully deplete the first channel region 1012 regarding mobile charge carriers of the second conductivity type. Accordingly, in response to receiving the second control signal, the semiconductor device 1 can further be configured to fully deplete the second channel region 1022 regarding mobile charge carriers of the second conductivity type.

In accordance with an embodiment, the first load terminal structure 11 includes a source terminal (also referred to as "emitter terminal") and the second load terminal structure 12 includes a drain terminal (also referred to as "collector terminal") and the control terminal structure 13 includes a gate terminal. Thus, the first port region 1011 of the first mesa 101 may constitute a source region, e.g., a semiconductor source region.

For example, for setting the semiconductor device 1 into a conducting state, during which the total load current 15 between the load terminal structures 11, 12 may be conducted in a forward direction, the first control electrode 131 may be provided with the first control signal having a voltage within a first range so as to induce an inversion channel within a first channel region 1012. For example, the voltage is applied between the first control electrode 131 and the first load terminal structure 11. In an embodiment, the electrical potential of the first control electrode 131 is greater than the electrical potential of the first load terminal structure 11 if the applied voltage is within the first range.

For setting the semiconductor device 1 into a blocking state in which a voltage applied between the second load terminal structure 12 and the first load terminal structure 11 in the forward direction may be blocked and flow of the load current 15 in the forward direction is prevented, the first control electrode 131 may be provided with the control signal having a voltage within the second range different from the first range so as to induce a depletion region, e.g., at a transition between the first channel region 1012 and the drift region 100. For example, the voltage is applied between the first load terminal structure 11 and the first control electrode 131. In an embodiment, the electrical potential of the first control electrode 131 is equal to or lower than the electrical potential of the first load terminal structure 11 if the applied voltage is within the second range.

For example, the structure as schematically illustrated in each of FIGS. 1A to 3B can be employed for forming one or more device cells of an IGBT, an RC-IGBT, a MOSFET and the like. In an embodiment, the semiconductor device 1 is one of an IGBT, an RC-IGBT or a MOSFET.

According to the aforesaid, an embodiment of the operation and the configuration of the semiconductor device 1 can be summarized as follows. The semiconductor device 1 can be configured to be set into the conducting state by providing the control signal with a voltage within said first range. In response to receiving such control signal, the first cell 141 may be configured to induce an inversion channel within the first channel region 1012 such that the first load current 151 of first charge carriers of the first conductivity type may traverse the first mesa 101. Simultaneously, the first cell 141 may be configured to fully deplete the first channel region 1012 with regards to charge carriers of the second conductivity type and to thus drastically reduce or inhibit a flow of the second load current 152 within the first mesa 101. Further, in response to receiving such control signal, the second cell 142 may be configured to fully deplete the second channel region 1022 with regards to charge carriers of the second conductivity type and to thus inhibit a flow of each of first load current 151 and the second load current 152 within the second mesa 102. Thus, during the conducting state, the total load current within the cells 141 and 142 may be at least dominated or even constituted by the substantially the first load current 151 only, as the second load current 152 substantially amounts to zero within said cells 141 and 142. For switching the semiconductor device 1 from the conducting state to the blocking state, the control signal may be provided with a voltage within said second range different form the first range. In response to receiving such control signal, the semiconductor device 1 may be configured to cause movement of mobile charge carriers out of the semiconductor body 10. To this end, the first cell 141 may be configured to cut-off the first load current 151 within the first mesa 101 by breaking down said inversion channel. Simultaneously, the second cell 142 may be configured to induce an accumulation channel within the second channel region 1022 so as to allow flow of the second load current 152 within the second mesa. In fact, such second load current 152 can be considered to a be a removal current, as it causes the semiconductor body 10 to be depleted regarding second charge carriers of the second conductivity type. Thus, during switch-off, the total load current 15 within the cells 141 and 142, i.e., the total load current 15 in proximity to the first load terminal structure 11, may dominated by or even substantially be constituted by the second load current 152 within the second cell 142.

Figure 4:
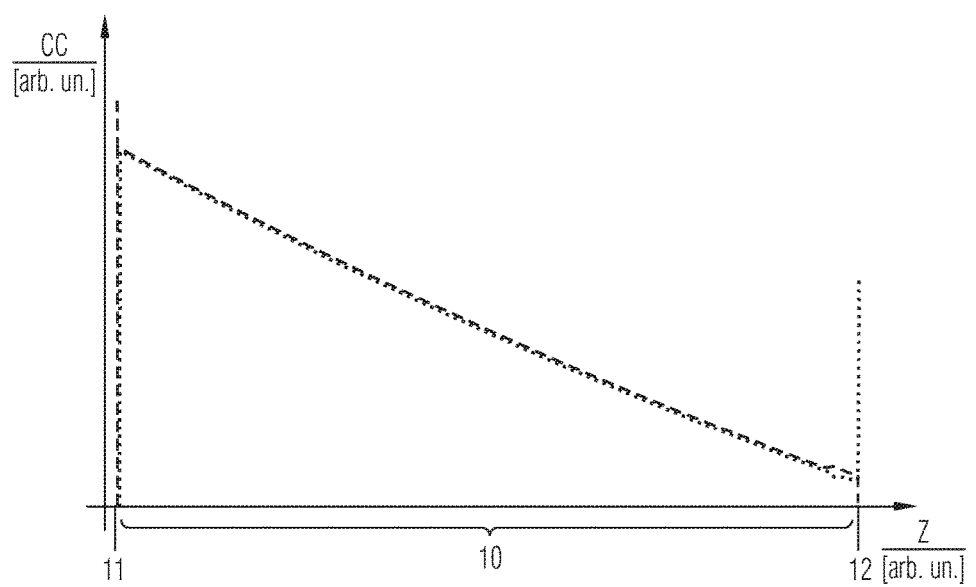
FIG. 4 schematically illustrates distributions of charge carrier concentrations in a semiconductor body of a power semiconductor device in accordance with one or more embodiments.

FIG. 4 schematically illustrates exemplary distributions of charge carrier concentrations in the semiconductor body 10 of the semiconductor device 1 when being in the conducting state, in accordance with one or more embodiments. The dashed line exemplarily illustrates the distribution of the concentration (CC) of charge carriers of the first conductivity type, e.g., electrons, along the extension direction Z, and the dotted line exemplarily illustrates the distribution of the concentration (CC) of charge carriers of the second conductivity type, e.g., holes, along the extension direction Z. As illustrated, in proximity to the first load terminal structure 11, e.g., within the cells 141 and 142 the concentration of the charge carriers of the first conductivity type can be higher as compared to the concentration of the charge carriers of the second conductivity type, e.g., due to the reasons as they were outlined in the preceding paragraph and because doping regions in the cells 141 and 142 may contribute to the curves.

Along the extension of the semiconductor body 10 in the extension direction Z, e.g., within the drift region 100, the concentration of the charge carriers of the first conductivity type can be substantially equal to the concentration of the charge carriers of the second conductivity type, e.g., due to the physical requirement of charge neutrality that may be established within the electron-hole plasma inside the drift region 100.

In proximity to the second load terminal structure 12, the concentration of the charge carriers of the second conductivity type may be significantly higher as compared to the concentration of the charge carriers of the first conductivity type, e.g., since charge carriers of the first conductivity type may continuously move from the semiconductor body 10 to the second load terminal structure 12, and wherein charge carriers of the second conductivity type may be continuously pumped into the drift region 100 out of said first emitter that may be included within the third port region 103 electrically connected to the second load terminal structure 12, wherein the first emitter may comprise have the second conductivity type. According to another embodiment not illustrated in FIG. 4, in proximity of the second load terminal structure 12, also the density of the charge carriers of the first conductivity type may be much larger in an area close to a doping region of the first conductivity type, e. g., in order to implement a reverse conductivity of the semiconductor device 1 as stated earlier. In an area of a buffer or field stop region, differences in the densities of the charge carriers of the first and second conductivity type may occur.

For example, the semiconductor device 1 may be configured to induce, within the semiconductor body 10, e.g., within the drift region 100, a total concentration of charge carriers greater than $10^{16}$ cm$^{-3}$, or even greater than $10^{17}$ cm$^{-3}$, or even greater than $2*10^{17}$ cm$^{-3}$. Such high concentration of charge carriers may allow for achieving a comparatively low on-state voltage during the conducting state, i.e., a voltage between the first load terminal structure 11 and the second load terminal structure 12 of less than 1 V, less than 0.9 V, or even less than 0.8 V at a nominal load current or at a load current density flowing through a horizontal cross-section of the semiconductor device 1 of at least 100 A/cm$^2$ and at about 20° C. Said on-state voltage may be substantially caused by a pn-junction (not illustrated) in proximity to the second load terminal structure 12. Thus, the drop of the on-state voltage may be asymmetrically distributed along the distance between the first load terminal structure 11 and the second load terminal structure 12, e.g., due to the main change in voltage occurring in proximity to the second load terminal structure 12 and a negligible voltage change occurring in proximity to the first load terminal structure 11. If, for example, the semiconductor body 10 is mainly based on silicon (Si), an on-state voltage of significantly less than 0.7 V can hardly be achieved.

Figure 5A:
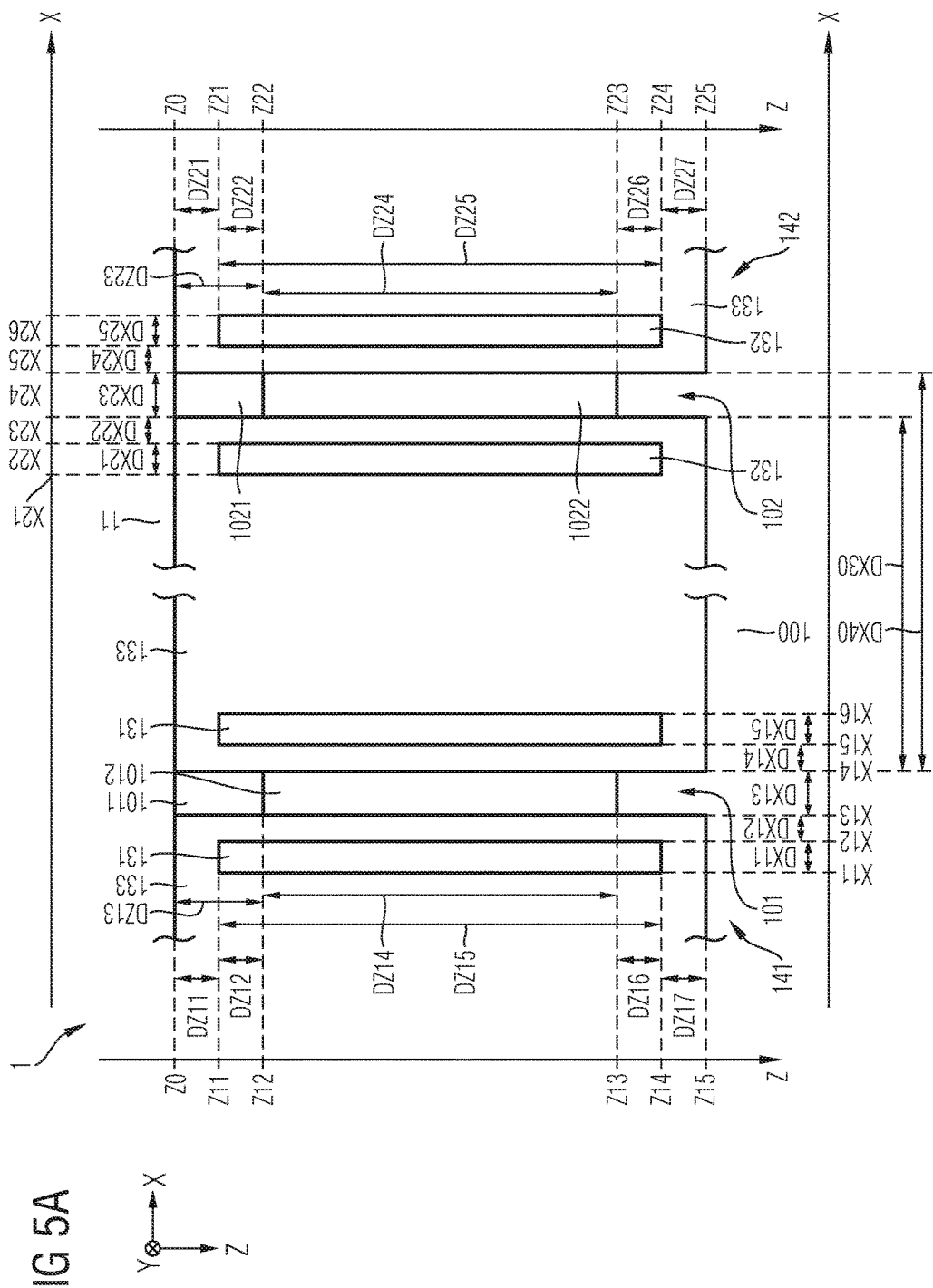
FIG. 5A schematically illustrates a section of a vertical cross-section of a power semiconductor device in accordance with one or more embodiments.

With regards to FIG. 5A, some exemplarily spatial dimensions of the first cell 141 and the second cell 142 shall be explained. Before giving specific values, it shall be understood that the cells 14 including the first cell 141 and the second cell 142 may either exhibit a stripe configuration or a needle configuration, as has been explained with respect to FIG. 1A.

In the first case ("stripe"), as schematically illustrated in FIG. 5B, each of the first mesa 101 and the second mesa 102 may exhibit the shape of a fin that has a total lateral extension along the one lateral direction (e.g., Y) that amounts to at least a multiple of the total lateral extension in the other lateral direction (e.g., X). For example, the fin shaped mesa 101 and 102 may extend substantially along the entire active cell field 16 in one lateral direction.

In the second case ("needle"), as schematically illustrated in FIG. 5C, each of the first mesa 101 and the second mesa 102 may exhibit the shape of a wire. For example, the mesa 101 and 102 may each have a circular or rectangular cross-section in parallel to a horizontal plane and may each be completely surrounded by the insulation structure 133.

Thus, in accordance with the embodiment schematically illustrated in FIG. 5A, the cells 141 and 142 may exhibit a needle configuration or a stripe configuration, for example. In another embodiment, the first cell 141 may exhibit a stripe configuration and the second cell 142 may exhibit a needle configuration or vice versa.

In an embodiment, the first port region 1011 and the second port region 1021 each extend, from their respective contact with the first load terminal structure 11 at the level Z0 (which may be at 0 nm), along the extension direction Z to a level Z12 or, respectively, to a level Z22, which may each be within the range of 30 nm to 500 nm, within the range of 50 nm to 400 nm, or within the range of 50 nm to 300 nm. The levels Z12 and Z22 may be substantially identical to each other. Accordingly, along the extension direction Z, the first port region 1011 may have a total extension DZ13 within the range of 30 nm to 500 nm, within the range of 50 nm to 400 nm, or within the range of 50 nm to 300 nm, and the second port region 1021 may have a total extension DZ23 in the extension direction Z substantially identical to DZ13.

Further, the first channel region 1012 and the second channel region 1022 may each extend, from the contact with the first port region 1011 at the level Z12 or, respectively, from the contact with the second port region 1021 at the level Z22, along the extension direction Z to a level Z13 or, respectively, to a level Z23, which may each be within the range of 50 nm to 700 nm, within the range of 60 nm to 550 nm, or within the range of 100 nm to 400 nm. The levels Z13 and Z23 may be identical to each other. Accordingly, along the extension direction Z, the first channel region 1012 may have a total extension DZ14 within the range of 50 nm to 700 nm, within the range of 80 nm to 550 nm, or within the range of 150 nm to 400 nm, and the second channel region 1022 may have a total extension DZ24 in the extension direction Z substantially identical to DZ14.

The first control electrode 131 and the second control electrode 132 may be spaced apart from the first load terminal structure 11 along the extension direction Z by a distance DZ11 or, respectively, DZ21, which may be equal to DZ11. Thus, said distances DZ11 and DZ21 may be identical to the thickness of the section of the insulation structure 133 that isolates the control electrodes 131 and 132 from the first load terminal structure 11 along the extension direction Z. Each of DZ11 and DZ21 can be within the range of 10 nm to 490 nm, within the range of 20 nm to 180 nm, or within the range of 50 nm to 250 nm. In other words, the first control electrode 131 may exhibit a proximal end that is arranged at a level Z11 corresponding to DZ11 in terms of magnitude, and the second control electrode 132 may exhibit a proximal end that is arranged at a level Z21 corresponding to DZ11 in terms of magnitude.

In an embodiment, the first control electrode 131 may exhibit a total extension DZ15 along the extension direction Z that is greater than the total extension DZ14 of the first channel region 1012 and can be arranged such that it exhibits a common extension range along the extension direction Z with the first channel region 1012 greater than 100% of the total extension DZ14 of the first channel region 1012, as schematically illustrated in FIG. 5A. Thus, said total extension DZ15 of the first control electrode 131 may amount to at least a factor of 1.1 of DZ14, a factor of 1.3 of DZ14 or even to a factor of 1.5 of DZ14. Against the extension direction Z, there may be an overlap DZ12 within the range of 10 nm to 490 nm, within the range of 20 nm to 380 nm, or within the range of 50 nm to 250 nm, which may be, at the same time, a common extension range with the first port region 1011. In the extension direction Z, the first control electrode 131 may exhibit an overlap DZ16 within the range of 10 nm to 490 nm, within the range of 20 nm to 380 nm, or within the range of 50 nm to 250 nm, which may be, at the same time, a common extension range with the drift region 100. Further, the first control electrode 131 may exhibit a distal end at a level Z14 that is spaced apart from a distal end of the insulation structure 133 at a level Z15 by a distance DZ17, which may be within the range of 60 nm to 1200 nm, within the range of 100 nm to 900 nm, or within the range of 200 nm to 650 nm.

What has been stated above with respect to the extension and the arrangement the first control electrode 131 along the extension direction Z may equally apply to the second control electrode 132 and its relative position with respect to the second channel region 1022. Thus, the values of DZ25 may be within the same range as DZ15, the values of DZ21 may be within the same range as DZ11, the values of DZ22 may be within the same range as DZ12, and the values of DZ26 may be within the same range as DZ16. Further, the second control electrode 132 may exhibit a distal end at level Z24 that is spaced apart from a distal end of the insulation structure 133 at level Z25 by a distance DZ27, wherein the values of DZ27 may be within the same range as DZ17.

Along the first lateral direction X, the first control electrode 131 may be spaced apart from the first channel region 1021 by a distance DX12 that may be within the range of 1 nm to 100 nm, within the range of 2 nm to 50 nm, or within the range of 3 nm to 20 nm. Said distance DX12 may be identical to a thickness of the insulation structure 133 that isolates the first control electrode 131 from the first mesa 101 along the first lateral direction X. Accordingly, along the first lateral direction X, the second control electrode 132 may be spaced apart from the second channel region 1022 by a distance DX22 that may be within the range of 1 nm to 100 nm, within the range of 2 nm to 50 nm, or within the range of 3 nm to 20 nm. Said distance DX22 may be identical to a thickness of the insulation structure 133 that isolates the second control electrode 132 from the second mesa 102 along the first lateral direction X.

The thickness DX11 of the first control electrode 131 along the first lateral direction X may be within the range of 10 nm to 10,000 nm, within the range of 50 nm to 7,000 nm, or within the range of 100 nm to 5,000 nm. The thickness DX21 of the second control electrode 132 along the first lateral direction X may be in same range as the thickness DX11 or in another of said ranges described above with regard to the thickness DX11. As mentioned in the above, in contrast to the exemplary schematic representation in FIG. 5A, the control electrodes 131 and 132 can be in contact with each other (i.e., in FIG. 5A, X16 would be equal to X21) in accordance with one or more embodiments, thereby forming a joint control electrode that may be used for controlling each of the first cell 141 and the second cell 142.

In the embodiment in accordance with FIG. 5A, the cells 141 and 142 may exhibit a needle configuration or a stripe configuration, as has been explained above. For example, in the first case ("needle") the cells 141 and 142 may each exhibit, e.g., a radially symmetrical structure and the section of the vertical cross-section of FIG. 5A indeed only depicts a single first control electrode 131 exhibiting, e.g., a cylinder shape, and a single second control electrode 132 exhibiting, e.g., also a cylinder shape coating the first mesa 101 or, respectively, the second mesa 102. In this case, each of the first lateral direction X and the second lateral direction Y denotes a radial direction. Further, the needle cells could also exhibit, in parallel to the YX plane, a rectangular cross-section, e.g., with rounded corners or an elliptical cross-section. In the second case ("stripe"), the first cell 141 may comprise a monolithic first control electrode 131 that flanks the first mesa 101 only on one lateral side, and, accordingly, the second cell 142 may also comprise a monolithic second control electrode 132 that flanks the second mesa 102 only on one lateral side. In another embodiment, as illustrated in FIG. 5A, the first control electrode 131 can be a multi-part, e.g., a two-part first electrode 131, and the second control electrode 132 can also be a multi-part, e.g., a two-part second electrode 132. For example, in accordance with the embodiment of FIG. 5A, if the cells 141 and 142 exhibit a stripe configuration, the first control electrode 131 may be a two-part first control electrode 131 arranged mirror symmetrically along the first lateral direction X with regards to the first mesa 101, and the second control electrode 132 may be a two-part second control electrode 132 arranged mirror symmetrically along the first lateral direction X with regards to the second mesa 102. Thus, what has been stated above with respect to the dimension DX11, DX21 and DX12, DX22 may equally apply to the dimensions DX14, DX24 and DX15, DX25 indicated in FIG. 5A.

As has been explained above, the spatial dimensions of the mesa 101 and 102 and their components may each be confined by the insulation structure 133. The total extension Z15 of each of the first mesa 101 and the second mesa 102 in parallel to the path of the first load current 151 or, respectively, the second load current 152, which may be in parallel to the extension direction Z, may amount to at least a multiple of the respective total extensions DX13, DX23 perpendicular to the load current paths, e.g., in at least one of the first lateral direction X and the second lateral direction Y.

For example, the width DX13 of the first channel region 1012 of the first mesa 101 in a direction perpendicular to the course of the first load current 151 within the first mesa 101, e.g., in a direction perpendicular to the extension direction Z, e.g., the first lateral direction X, may be smaller than 100 nm, smaller than 60 nm, or even smaller than 40 nm over a distance in a direction of first load current 151 within the first mesa 101, e.g., along a direction in parallel to the extension direction Z, amounting to at least three times of DX13. For example, the first channel region 1012 may exhibit a width of DX13 smaller than 100 nm along at least 300 nm in the extension direction Z, a width of DX13 smaller than 60 nm along at least 180 nm in the extension direction Z, or a width of DX13 smaller than 40 nm along at least 120 nm in the extension direction Z.

Analogously, the width DX23 of the second channel region 1022 of the second mesa 102 in a direction perpendicular to the course of the second load current 152 within the second mesa 102, e.g., in a direction perpendicular to the extension direction Z, e.g., the first lateral direction X, may be smaller than 100 nm, smaller than 60 nm, or even smaller than 40 nm over a distance in a direction of second load current 152 within the second mesa 102, e.g., along a direction in parallel to the extension direction Z, amounting to at least three times of DX23. For example, the second channel region 1022 may exhibit a width of DX23 smaller than 100 nm along at least 300 nm in the extension direction Z, a width of DX23 smaller than 60 nm along at least 180 nm in the extension direction Z, or a width of DX23 smaller than 40 nm along at least 120 nm in the extension direction Z.

It shall be understood that, in contrast to the schematic representation in FIG. 5A, the insulation structure 133 must not necessarily extend at least as far in the extension direction Z as the first control electrode 131 along the entire distance DX30 between the first mesa 101 and the second mesa 102, but may extend less in the extension direction Z, e.g., being in the same range as the total extension of the first port region 1011 or, respectively, the total extension of the second port region 1021 in the extension direction Z (DZ13, DZ23 in FIG. 5A), e.g., along at least 80% of the distance DX30 between the first mesa 101 and the second mesa 102.

The distance between the first cell 141 and the second cell 142 along one of the first lateral direction X and the second lateral direction Y, in the following also referred to as "inter-cell pitch" DX40, may be within the range of 100 nm to 15,000 nm, within the range of 300 nm to 10,000 nm, or within the range of 500 nm to 8,000 nm.

In an embodiment, the first mesa 101 is dimensioned in accordance with following equation (1) presented below $$DX13 \le 2 * W\mathrm{max};$$

$$W\mathrm{max} = \sqrt{\frac{4 * \varepsilon * k * T * \ln\left(\frac{N_A}{n_i}\right)}{q^2 * N_A}}$$

Accordingly, in an embodiment, DX13, i.e., the width of the first channel region 1011, is equal to or smaller than twice of a maximal width Wmax along at least 80%, at least 90%, or along at least 95%, or even along at least 99% of the total extension of the first mesa 101 in the extension direction Z, the maximal width Wmax being determined in accordance with equation (1) presented above, wherein
□=dielectric constant of the material of the first channel region 1012;
k=Boltzmann constant;
T=Temperature;
ln denotes the natural logarithm;
$N_A$=dopant concentration of the material of the first channel region 1012;
$n_i$=intrinsic carrier concentration (e.g., $1.45*10^{10}$ in case of Si at 27° C.); and
q=elementary charge.

In an embodiment, the second mesa 102 is accordingly dimensioned, i.e., DX23 being equal to or smaller than twice of a maximal width Wmax along at least 80%, at least 90%, or along at least 95%, or even along at least 99% of the total extension of the first mesa 101 in the extension direction Z, the maximal width Wmax being determined with values applicable for the second channel region 1022.

For example, each of DX13 and DX23 is within a range of 15 nm to 100 nm, while each of the dopant concentration of the first channel region 1012 and the dopant concentration of the second channel region 1022 is greater than $8*10^{18}$ cm$^{-3}$.

In an embodiment, each of the first port region 1011, the first channel region 1012, the second port region 1021 and the second channel region 1022 may thus constitute a nanometer-scale structure having a spatial dimension in at least one of the first lateral direction X, the second lateral direction Y and the extension direction Z of less than 100 nm. In an embodiment, said at least one direction along which the respective region exhibits an extension of less than 100 nm is perpendicular to the direction of the applicable load current conducted within the respective region.

Figure 6:
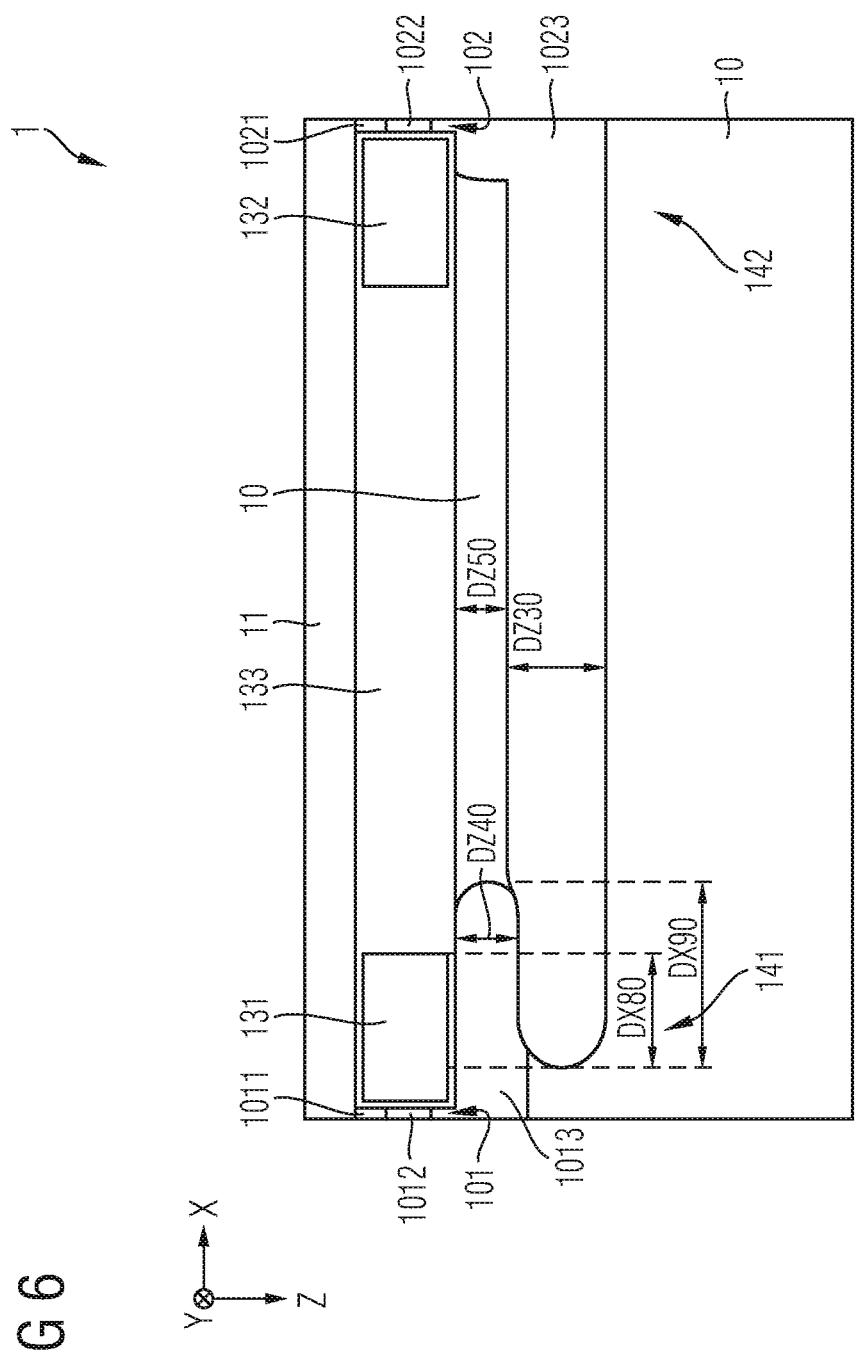
FIG. 6 schematically illustrates a section of a vertical cross-section of a power semiconductor device in accordance with one or more embodiments.

In accordance with the embodiment that is schematically and exemplarily illustrated in FIG. 6, the semiconductor body 10 may further comprise a first plateau region 1013 and a second plateau region 1023.

The first plateau region 1013 may be in contact with the first channel region 1012 and may exhibit dopants of a conductivity type complimentary to the dopants of the first channel region 1012. Thus, the first plateau region 1013 may have the first conductivity type.

The second plateau region 1023 may be in contact with the second channel region 1022 and may exhibit dopants of a conductivity type identical to the dopants of the second channel region 1022. Thus, the second plateau region 1023 may have the second conductivity type.

For example, the second plateau region 1023 extends towards the first control electrode 131 and the first plateau region 1013 extends towards the second control electrode 132. For example, the second plateau region 1023 and the first control electrode 131 may exhibit a common lateral extension range DX80. For example, the distance between the first mesa 101 and the second mesa 102 along the first lateral direction X amounts to less than 200 nm, to less than 150 nm or to even less than 100 nm. Further, the second plateau region 1023 may exhibit a varying dopant concentration along the extension direction Z that may exhibit, e.g., a maximum at approximately a center of the average total extension DZ30 along the extension direction Z.

For example, the first plateau region 1013 extends towards the second control electrode 132. The first plateau region 1013 and the second plateau region 1023 may be in contact with each other and may exhibit a common lateral extension range DX90 of at least 20 nm, of at least 50 nm or of more than 100 nm along the first lateral direction X. The common lateral extension range DX90 may comprise the common lateral extension range DX80 at least partially. Thus, also the first plateau region 1013 and the first control electrode 131 may exhibit a common lateral extension range. Further, the first plateau region 1013 may exhibit a varying dopant concentration along the extension direction Z that may exhibit, e.g., a maximum at approximately a center of the average total extension DZ40 along the extension direction Z.

In an embodiment, the second plateau region 1023 extends further into the semiconductor drift region 100 along the extension direction Z as compared to the first plateau region 1013.

Further exemplary embodiments of the first plateau region 1013 and the second plateau region 1023 are schematically illustrated in FIG. 7 and in FIG. 8.

Accordingly, the first plateau region 1013 may be in contact with the first channel region 1012, wherein the transition 1014 between the two regions may be established within the first mesa 101. For example, in case of the first channel region 1012 having the second conductivity type and in case of the first plateau region 1013 having the first conductivity type, as in the example of FIG. 6, the transition 1014 between the first channel region 1012 and the first plateau region 1013 may establish a pn-junction. Said pn-junction may be established within the first mesa 101. Starting at the transition 1014, the first plateau region 1013 may extend further along the extension direction Z than the first mesa 101 that is spatially confined by the insulation structure 133. In an embodiment, the dopant concentration of the first plateau region 1013 may vary along the extension direction Z. For example, at the transition to the first channel region 1012, the dopant concentration may be in the range of the dopant concentration of the drift region 100 and may then increase along the extension direction Z, e.g., to a peak value in the center (in terms of the extension along the extension direction Z) and then decrease again, e.g., to a value comparable to the drift region dopant concentration.

For example, external of the first mesa 101, the first plateau region 1013 may extend in both the extension direction Z and each of a direction in parallel to the first lateral direction X and in anti-parallel to the first lateral direction X. For example, in the section of the first plateau region 1013 that is arranged external of the first mesa 101, the first plateau region 1013 can be in contact with the insulation structure 133 over at least a portion of its total extension DX70 along the first lateral direction X, wherein said portion may be within the range of, e.g., 10% to 100% of DX70. A possibly remaining section of the total lateral extension along the first lateral direction X that is external of the first mesa 101 may be separated from the insulation structure 133 by means of the drift region 100, wherein the distance DZ60 along the extension direction Z may be within the range of up to 300 nm, within the range of up to 200 nm, or within the range of up to 150 nm. And, speaking of the insulation structure 133, as has been explained above, the control electrodes 131 and 132 may also be arranged in contact with each other in accordance with one or more embodiments, thereby forming a monolithic control electrode used for controlling each of the first cell 141 and the second cell 142. In other words, in an embodiment, the control electrodes 131 and 132 can be respective sections of one joint control electrode, yielding that the control electrodes 131 and 132—in contrast to the schematic and exemplary representation in FIG. 6—would not be separated from each other by the insulation structure 133.

The total lateral extension DX70 may be a at least a multiple of the width DX13 of the first mesa 101 (indicated in FIG. 5A), e.g., amounting to a factor within the range of 2 to 1000, within the range of 4 to 700, or within the range of 10 to 500 of DX13. Thus, DX70 can be, e.g., within the range of 40 nm to 10,000 nm, within the range of 80 nm to 7,000 nm, or within the range of 200 nm to 5,000 nm. Further, in the section of the first plateau region 1013 that is arranged external of the first mesa 101, the first plateau region 1013 may exhibit a total extension DZ40 along the extension direction Z, which may be in a similar range as the total extension Z15 (cf. FIG. 5A) of the first mesa 101 along the extension direction Z. For example, DZ40 can be within the range of up to 600 nm, within the range of up to 500 nm, or within the range of up to 400 nm. As illustrated in FIG. 7, the DZ40 may vary along the total extension in the first lateral direction X of the first plateau region 1013. Further, in contrast to the schematic and exemplary representation in FIG. 6, the first plateau region 1013 may extend further along first lateral direction X, e.g., close to the second mesa 102.

Further, regarding the exemplary embodiment in accordance with FIG. 8, the second plateau region 1023 may be in contact with the second channel region 1022, wherein the transition between the two regions may be established within the second mesa 102. However, in case of the second channel region 1022 having the second conductivity type and in case of the second plateau region 1023 having also dopants of the second conductivity type, as in the example of FIG. 6, the transition between the second channel region 1022 and the second plateau region 1023 may be established, e.g., by a change of a dopant concentration along the extension direction Z, only. Said change may be present within the second mesa 102.

Starting at said transition within the second mesa 102, the second plateau region 1023 may extend further along the extension direction Z than the second mesa 102 that is spatially confined by the insulation structure 133. For example, external of the second mesa 102, the second plateau region 1023 may extend in both the extension direction Z and each of a direction in parallel to the first lateral direction X and in anti-parallel to the first lateral direction X. For example, in the section of the second plateau region 1023 that is arranged external of the second mesa 102, the second plateau region 1023 is in contact with the insulation structure 133 over at least a portion of its total extension DX60 along the first lateral direction X, wherein said portion may be within the range of, e.g., 10% to 100% of DX60. A possibly remaining section of the total lateral extension along the first lateral direction X that is external of the second mesa 102 may be separated from the insulation structure 133 by means of the drift region 100, wherein the distance DZ50 along the extension direction Z may be within the range of 20 nm to 400 nm, within the range of 30 nm to 300 nm, or within the range of 50 nm to 200 nm.

The total lateral extension DX60 may be at least a multiple of the width DX23 of the second mesa 102 (indicated in FIG. 5A), e.g., amounting to a factor within the range of 2 to 1000, within the range of 4 to 700, or within the range of 10 to 500 of DX23. Thus, DX60 can be, e.g., within the range of 40 nm to 10,000 nm, within the range of 80 nm to 7,000 nm, or within the range of 200 nm to 5,000 nm. Further, in the section of the second plateau region 1023 that is arranged external of the second mesa 102, the second plateau region 1023 may exhibit a total extension DZ35 along the extension direction Z, which may be in a similar range as the total extension Z25 (cf. FIG. 5A) of the second mesa 102 along the extension direction Z. For example, DZ35 can be within the range of up to 1,000 nm, within the range of up to 700 nm, or within the range of up to 500 nm. As illustrated in FIG. 7, the DZ35 may vary along the total extension in the first lateral direction X of the second plateau region 1023, e.g., amounting to only DZ30 in the section that may be spaced apart from the insulation structure 133 by said distance DZ50 along the extension direction Z. For example, DZ30 can be within the range of 10 nm to 500 nm, within the range of 20 nm to 400 nm, or within the range of 30 nm to 600 nm.

Figure 9:
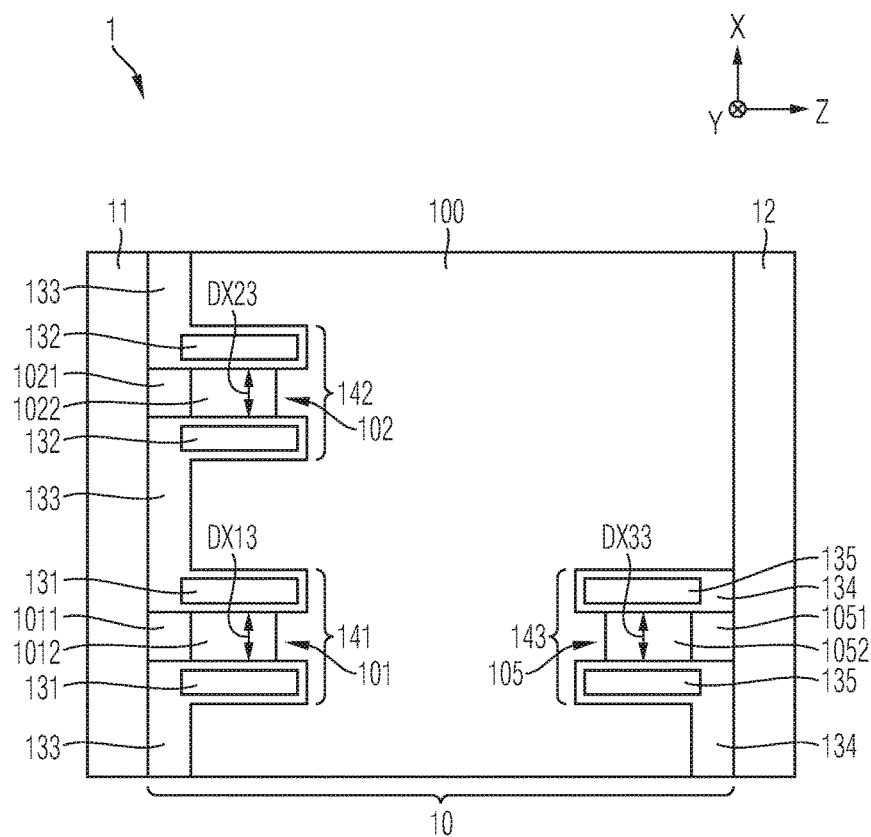
FIG. 9 schematically illustrates a section of a vertical cross-section of a power semiconductor device in accordance with one or more embodiment.

As schematically illustrated in FIG. 9, the semiconductor device 1 may further comprise at least one third cell 143 being electrically connected to the second load terminal structure 12 on the one side and to the drift region 100 on the other side.

Figure 10:
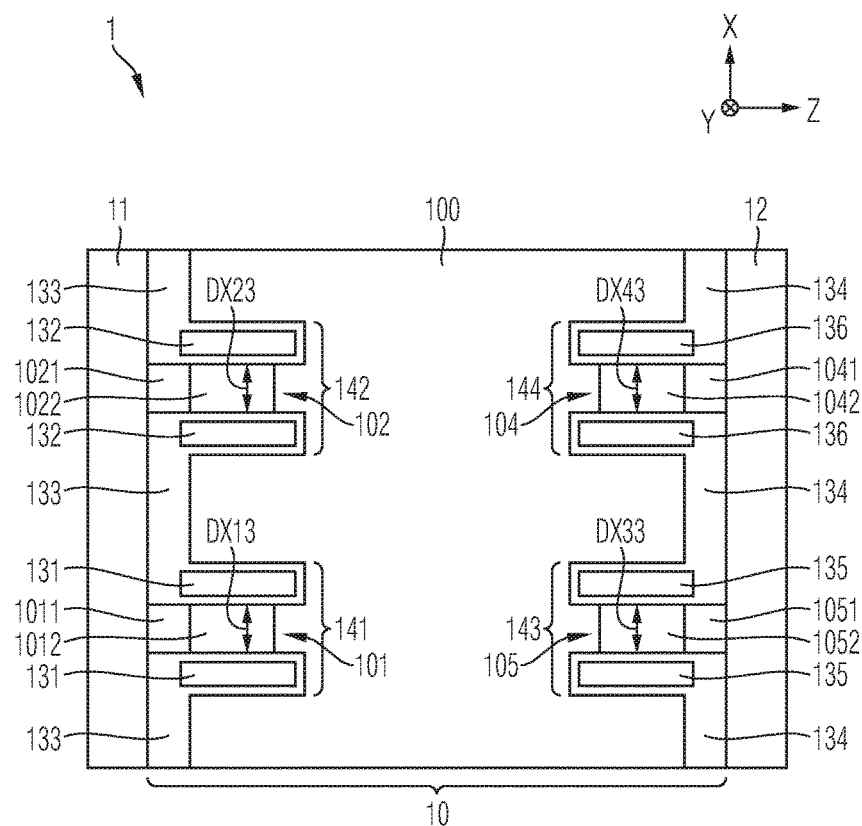
FIG. 10 schematically illustrates a section of a vertical cross-section of a power semiconductor device in accordance with one or more embodiment.

In a variant embodiment exemplarily and schematically illustrated in FIG. 10, the semiconductor device 1 may additionally comprise at least one fourth cell 144 that is also electrically connected to the second load terminal structure 12 on the one side and to the drift region 100 on the other side.

Thus, in an embodiment, the third cell 143 and/or each of the third cell 143 and the fourth cell 144 may form an interface between the drift region 100 of the semiconductor body 10 on the one side and the second load terminal structure 12 on the other side.

For example, the third cell 143 and/or the fourth cell 144 may each be arranged in the vicinity of and in electrical contact with a collector terminal structure 12 of an IGBT 1, in particular of an IGBT having a fully depletable channel region, which may be realized, e.g., at least in the first and/or second cells 141, 142, as described above.

Figure 11:
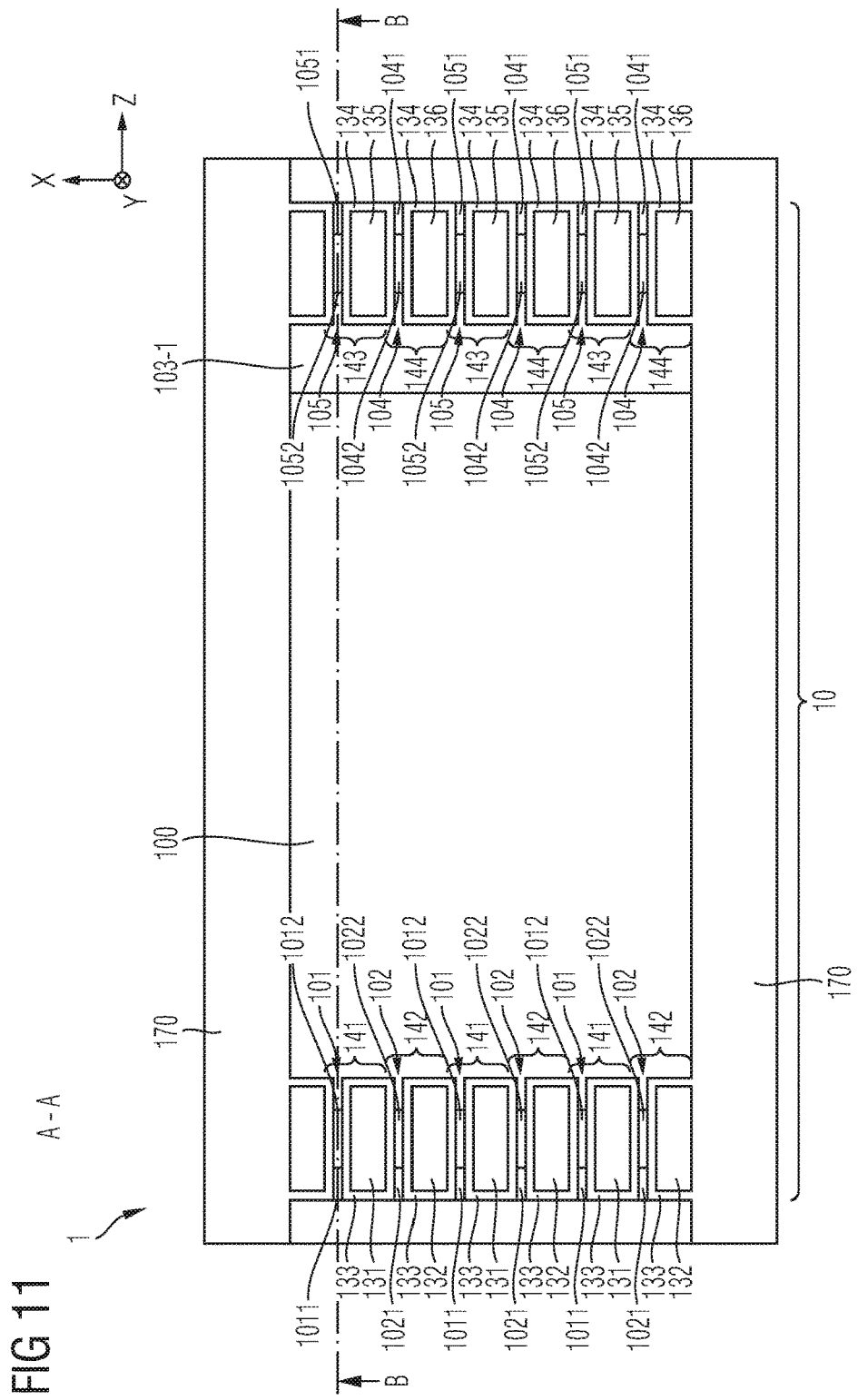
FIG. 11 schematically illustrates a section of a vertical cross-section of a power semiconductor device in accordance with one or more embodiment.
Figure 12:
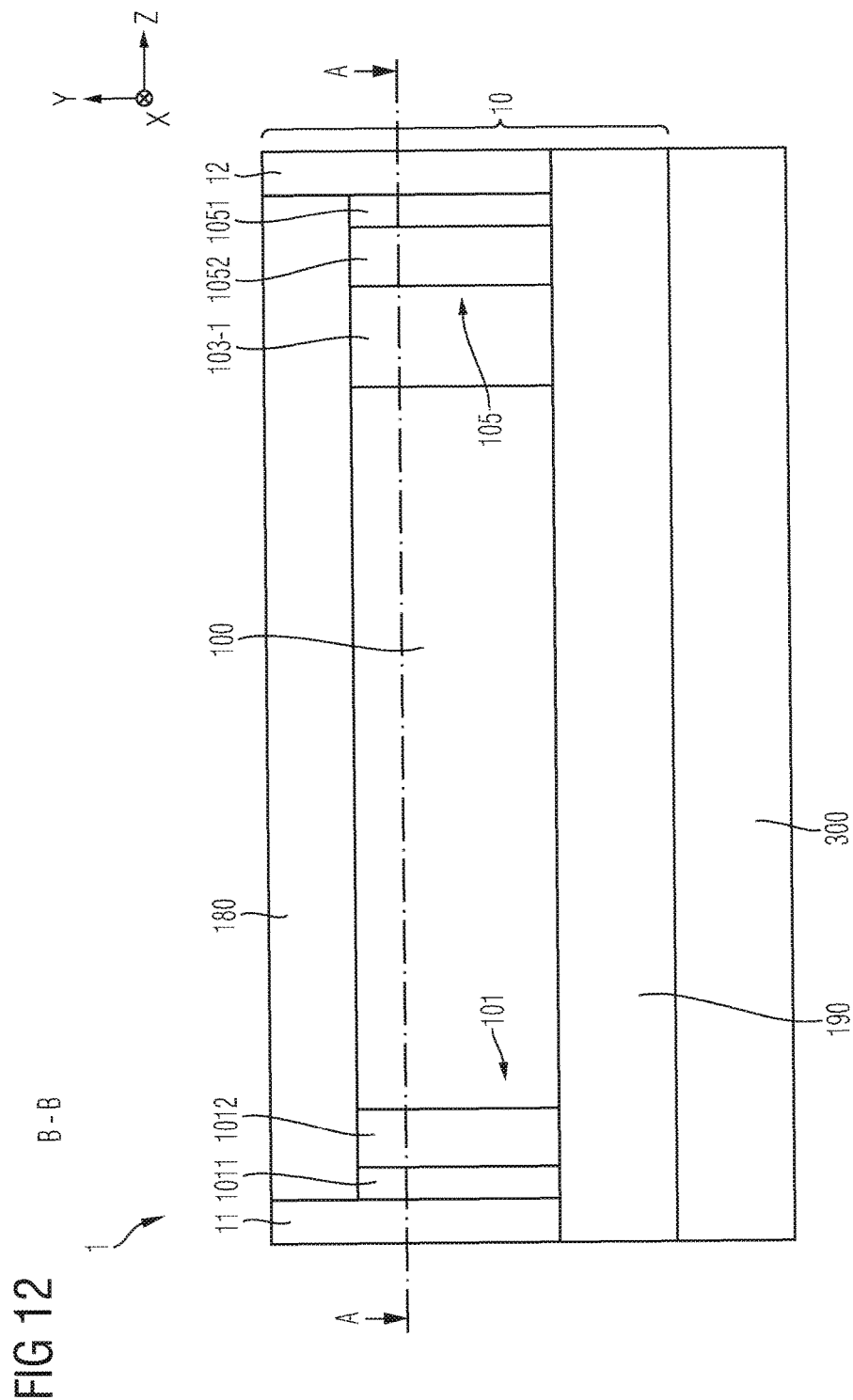
FIG. 12 schematically illustrates a section of a vertical cross-section of a power semiconductor device in accordance with one or more embodiment.

FIG. 11 schematically illustrates a section of a vertical cross-section of a power semiconductor device 1, such as an IGBT, which comprises a plurality of first, second, third, and fourth cells 141, 142, 143, 144 each. FIG. 12 shows another vertical cross-section of the embodiment of FIG. 11 along the line B-B.

The following description relating to the third cells 143 and/or the fourth cells 144 refers to all or some of FIGS. 9-12.

Figure 13:
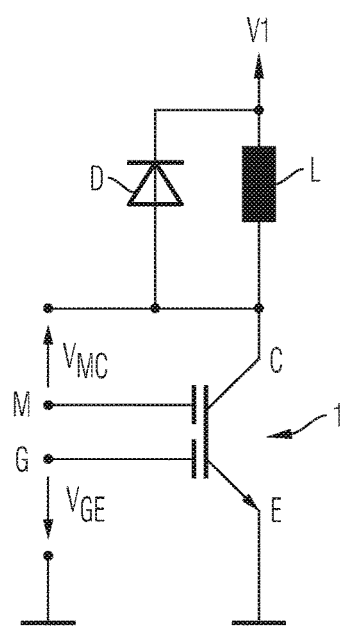
FIG. 13 illustrates a schematic circuit diagram in accordance with one or more embodiments.

Analogously to what has been described above in connection with the first cells, 141, the third cell 143 may comprise one or more of third control electrodes 135 that can be configured to receive a third control signal VMC (cf. FIG. 13). The third control electrodes 135 may be insulated from the semiconductor body 10 by means of a second insulation structure 134.

Likewise, the fourth cell 144 may comprise one or more of fourth control electrodes 136 that can be configured to receive a fourth control signal. The fourth control electrodes 136 may also be insulated from the semiconductor body 10 by means of the second insulation structure 134.

The material and the dimensions of the one or more third control electrodes 135 may be identical to the material and the dimensions of the one or more fourth control electrodes 136 or different therefrom. Further, the material and dimension of the one of more third and/or fourth control electrodes 135, 136 may be identical to the material and the dimensions of the one or more first and/or second control electrodes 131, 132 or different therefrom.

It shall be understood that in contrast to the exemplary schematic representations in FIGS. 9-11, the third and fourth control electrodes 135 and 136 may also be arranged in contact with each other in accordance with one or more embodiments, thereby forming a monolithic control electrode used for controlling each of the third cell 143 and the fourth cell 144. In other words, in an embodiment, the third and fourth control electrodes 135 and 136 can be respective sections of one joint control electrode.

The second insulation structure 134 may thus house each of the third control electrode(s) 135 and the fourth control electrode(s) 136. Further, one, more or each of the third control electrode(s) 135 and the fourth control electrode(s) 136 may be electrically insulated from the second load terminal structure 12.

The third cell 143 may include a third mesa 105 at least partially implemented as a part of the semiconductor body 10. Also, the fourth cell 144 may include a fourth mesa 104 that is at least partially implemented as a part of the semiconductor body 10. For example, each of the third mesa 105 and the fourth mesa 104 may be electrically connected to the second load terminal structure 12.

The third mesa 105 and/or the fourth mesa 104 may be spatially confined by the second insulation structure 134. For example, the spatial dimensions of the third mesa 105 and/or of the fourth mesa 104 and their components may be as exemplarily disclosed above with reference to FIG. 5 in connection with first mesa 101 and the second mesa 102, respectively.

The third mesa 105 may include a third port region 1051 electrically connected to the second load terminal structure 12. The third port region 1051 may be a third semiconductor port region. For example, the third port region 1051 has the first conductivity type, e.g., at a dopant concentration in the range of $10^{19}$ cm$^{-3}$ to $10^{22}$ cm$^{-3}$, e.g., $10^{20}$ cm$^{-3}$ to $5*10^{21}$ cm$^{-3}$. For example, the third port region 1051 is an n$^+$-region. For example, a dopant concentration of the third port region 1051 may be at least two orders of magnitude (corresponding to a factor of 100) greater than the dopant concentration of the drift region 100. As described above with reference to the first port region 1011, also the third port region 1051 may be a doped semiconductor region that has additionally been silicided so as to form a metal source.

Also, the fourth mesa 104 may include a fourth port region 1041 electrically connected to the second load terminal structure 12. The fourth port region 1041 may be a fourth semiconductor port region. For example, the fourth port region 1041 has the second conductivity type, e.g., at a dopant concentration in the range of $10^{18}$ cm$^{-3}$ to $10^{22}$ cm$^{-3}$, e.g., $10^{19}$ cm$^{-3}$ to $10^{21}$ cm$^{-3}$. For example, the fourth port region 1041 is a p$^+$-region. Thus, a dopant concentration of the fourth port region 1041 may be at least two orders of magnitude greater than the dopant concentration of the drift region 100. In an embodiment, the fourth port region 1041 is a doped semiconductor region that has additionally been silicided.

The third mesa 105 may further include a third channel region 1052 in contact with the third port region 1051. The third channel region 1052 may be a third semiconductor channel region. For example, the third channel region 1052 has the second conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the third channel region 1052 is a p-region or a p$^-$-region. In another embodiment, the third channel region 1052 has the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$.

For example, the third channel region 1052 may further be coupled to the semiconductor drift region 100, e.g., it may be in contact with the drift region 100 or may be coupled thereto by means of a plateau region (not illustrated in FIGS. 9-12) as described above in connection with the first and second channel regions 1012, 1022.

In an embodiment, the third channel region 1052 may isolate the third port region 1051 from the semiconductor drift region 100. Further, the third channel region 1052 may be an electrically floating region. For example, the third channel region 1052 is not in contact with the second load terminal structure 12 but separated therefrom by means of the third port region 1051.

The fourth mesa 104 may further include a fourth channel region 1042 in contact with the fourth port region 1041. The fourth channel region 1042 may be a second semiconductor channel region. For example, the fourth channel region 1042 has the second conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the fourth channel region 1042 is a p-region. In another embodiment, the fourth channel region 1042 has the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$.

For example, the fourth channel region 1042 may further be coupled to the semiconductor drift region 100, e.g., it may be in contact with the drift region 100 or may be coupled thereto by means of another plateau region (not illustrated in FIGS. 9-12) as described above in connection with the first and second channel regions 1012, 1022.

Further, the fourth channel region 1042 may isolate the fourth port region 1041 from the semiconductor drift region 100. Further, the fourth channel region 1042 may be an electrically floating region. For example, the fourth channel region 1042 is not in contact with the second load terminal structure 12 but separated therefrom by means of the fourth port region 1041. In another example, the fourth channel region 1042 may be of the same conductivity type as the fourth port region 1041 and the fourth channel region 1042 is only temporarily rendered into an insulating or floating state by applying a suitable work function of the material of the fourth control electrode 136 or a suitable electrical potential to the fourth control electrode 136.

The third mesa 105 can be a third semiconductor mesa and/or the fourth mesa 104 can be a fourth semiconductor mesa. In another embodiment, one or each of the third port region 1051 and the fourth port region 1052 may comprise a metal.

For example, the third port region 1051 amounts to a certain portion of the total volume of the third mesa 105, e.g., within the range of up to 75%, e.g., 10% to 75%, e.g., in the range of 20% to 50%. The third channel region 1052 may amount to another portion of the total volume of the third mesa 105, e.g., within the range of 10% to 90%, e.g., 25% to 90%, e.g., in the range of 25% to 75%.

The fourth port region 1041 may amount to a certain portion of the total volume of the fourth mesa 104, e.g., within the range of up to 75%, e.g., 10% to 75%, e.g., in the range of 20% to 50%. The fourth channel region 1042 may amount to another portion of the total volume of the fourth mesa 104, e.g., within the range of 10% to 90%, e.g., 25% to 90%, e.g., in the range of 25% to 75%.

In an embodiment, the third cell 143 including the third mesa 105 is configured to fully deplete the third channel region 1052 of mobile charge carriers of the second conductivity type in a conducting state of the semiconductor device 1.

Further, the fourth cell 144 including the second mesa 104 may be configured to fully deplete the second channel region 1042 of mobile charge carriers of the second conductivity type in a conducting state of the semiconductor device 1.

Thus, in accordance with an embodiment, the third channel region 1052 and/or the fourth channel region 1042 are fully depleted regions in a conducting state of the semiconductor device 1.

For example, the third channel region 1052 and/or the fourth channel region 1042 are fully depleted. This can be achieved by, e.g., choosing materials for the control electrodes 135, 136 resulting in work functions of the control electrodes 135, 136 which may differ from those of the channel regions 1052 and/or 1042. Additionally or alternatively, this can be achieved by setting the control electrodes 135, 136 to an appropriate electrical potential with respect to, e.g., the electrical potential of the second load terminal structure 12. Thus, in an embodiment, full depletion of the third channel region 1052 and/or the fourth channel region 1042 can be achieved due to a difference between the work function(s) of one or both of control electrodes 135, 136 on the one side and the work functions(s) of one or both of the channel regions 1052, 1042 on the other side and due to setting one or both of the control electrodes 135, 136 to a defined electrical potential.

In an embodiment, the third control electrode 135 of each third cell 143 is configured to induce an inversion channel within the third channel region 1052.

Further, the fourth cell(s) 144 may be configured to induce an accumulation channel within the fourth channel region 1042. For example, within each fourth cell 144, the fourth control electrode 136 may be configured for inducing said accumulation channel within the fourth channel region 1042.

As has been explained above, the spatial dimensions of the third mesa 105 and/or of the fourth mesa 104 and their components may each be confined by the second insulation structure 134. Analogously to what has been stated above for the first and second mesa 101, 102 with reference to FIG. 5A, a total extension the third mesa 105 and/or of the fourth mesa 104 in parallel to the path of a load current passing through the respective mesa 104, 105, which may be in parallel to the extension direction Z, may amount to at least a multiple of a respective total extensions DX33, DX43 perpendicular to the load current paths, e.g., in at least one of the first lateral direction X and the second lateral direction Y.

For example, a width DX33 of the third channel region 1052 of the third mesa 105 in a direction perpendicular to the course of the a current within the first mesa 101, e.g., in a direction perpendicular to the extension direction Z, e.g., the first lateral direction X, may be smaller than 100 nm, smaller than 60 nm, or even smaller than 40 nm over a distance in a direction of the load current within the third mesa 105, e.g., along a direction in parallel to the extension direction Z, amounting to at least three times of DX33. For example, the third channel region 1052 may exhibit a width of DX33 smaller than 100 nm along at least 300 nm in the extension direction Z, a width of DX33 smaller than 60 nm along at least 180 nm in the extension direction Z, or a width of DX33 smaller than 40 nm along at least 120 nm in the extension direction Z.

Analogously, a width DX43 of the fourth channel region 1042 of the fourth mesa 104 in a direction perpendicular to the course of a load current within the fourth mesa 104, e.g., in a direction perpendicular to the extension direction Z, e.g., the first lateral direction X, may be smaller than 100 nm, smaller than 60 nm, or even smaller than 40 nm over a distance in a direction of the load current within the fourth mesa 104, e.g., along a direction in parallel to the extension direction Z, amounting to at least three times of DX43. For example, the fourth channel region 1042 may exhibit a width of DX43 smaller than 100 nm along at least 300 nm in the extension direction Z, a width of DX43 smaller than 60 nm along at least 180 nm in the extension direction Z, or a width of DX43 smaller than 40 nm along at least 120 nm in the extension direction Z.

Further, as exemplarily illustrated in FIGS. 11-12, the drift region 100 may comprise a buffer region 103-1, also known as field stop region, which may include, e.g., dopants of the same conductivity type as the drift region 100, e.g., of the first conductivity type, but at a higher dopant concentration as compared to the dopant concentration of the drift region 100. For example, a dopant concentration in the buffer region 103-1 may be higher than a dopant concentration of the drift region 100 external of the buffer region 103-1 at least by a factor of 10, such as by a factor of 100 or even by a factor of 1000.

As further illustrated in FIGS. 11-12, the plurality of cells 141, 142, 143, 144 may be at least partially surrounded by and/or embedded within a structure 170, 180,190 comprising an insulation and/or passivating material, such as a silicon oxide. For example, with reference to FIG. 12, the components of the semiconductor body 10 described above may be arranged on top of silicon oxide layer 190, which in turn may be arranged on top of a carrier substrate 300. For example, the power semiconductor device 1 may have come into being by epitaxially growing the semiconductor regions described above on top of the carrier substrate 300 and/or the silicon oxide layer 190 along the second lateral direction Y. Additionally or alternatively, producing the power semiconductor device 1 may comprise bonding a semiconductor wafer on top of the carrier substrate 300 wherein in one or both of the semiconductor wafer and the carrier substrate 300 a silicon oxide layer is produced leading to the silicon oxide layer 190. After bonding, portions of the semiconductor wafers that are not required for producing the power semiconductor device 1 may be removed from the bonded wafer stack leaving the semiconductor layer for the semiconductor body 10 on top of the silicon oxide layer 190. Additionally or alternatively, said semiconductor regions may have been produced by masked and/or unmasked implantation and/or diffusion processes into the semiconductor body 10 along the second lateral direction Y (see FIG. 12). An insulation and/or passivation layer 180, which may comprise, e.g., a silicon oxide, may be provided on top of the cells 141, 142, 143, 144. Further insulation and/or passivation layers 170 may be provided for lateral protection (see FIG. 11).

For example, the power semiconductor device 1 is a lateral power semiconductor device 1, such as a lateral IGBT, as illustrated in FIGS. 11-12. Alternatively, the power semiconductor device 1 may be a vertical power semiconductor device 1, such as a vertical IGBT.

For example, a plurality of power semiconductor devices 1 in accordance with one or more embodiments may be arranged on the same carrier substrate 300, wherein the plurality of semiconductor devices 1 may be canonically insulated from each other. Thus, a component comprising several power semiconductor devices 1 integrated on a chip.

FIG. 13 illustrates a schematic circuit diagram comprising the power semiconductor device 1 in accordance with one or more embodiments. The circuit comprises a load L, which is on one side connected to a potential V1. On the other side, the load L is connected to a second load terminal C of the power semiconductor device 1, which may be, for example, a collector terminal of an IGBT 1. The second load terminal C may be electrically connected with the second load terminal structure 12 of the power semiconductor device 1. Further, the power semiconductor device 1 may comprise a first load terminal E, such as an emitter terminal of an IGBT, which may be electrically connected to the first load terminal structure 11. The first load terminal E may be connected to the ground potential or to another reference potential. The provision of current and/or voltage to the load L can be controlled by switching the power semiconductor device 1. Further, a free-wheeling diode D may be provided for enabling switching of an ohmic-inductive load L.

For controlling the operation of the power semiconductor device 1, a first control signal may be provided in the form of a first gate voltage VGE that is applied between the first load terminal E and a first gate terminal G being electrically connected with the first control electrode 131. Further, a third control signal in may be provided in the form of a third gate voltage VMC that is applied between the second load terminal C and third gate terminal and being electrically connected with the third control electrode 135.

It is also conceivable to further provide a second gate terminal and/or a fourth gate terminal (not depicted in FIG. 13) being electrically connected with the second control electrode 132 or with the fourth control electrode 136, respectively, so as to provide separate second and/or fourth control signals in the form of corresponding gate voltages.

In an embodiment in accordance with FIGS. 10-12, the power semiconductor device 1 may be configured to block a voltage and/or conduct a load current 15 selectively in both directions between the first load terminal E and the second load terminal C. For example, the power semiconductor device 1 may operate as a bidirectional power semiconductor device 1, such as a bidirectional IGBT.

For example, the operation of the bidirectional power semiconductor device 1 may be controlled by providing a first gate voltage VGE to the first gate terminal G in a forward conducting state of the power semiconductor device 1, wherein the power semiconductor device 1 may load current 15 and/or block a voltage in the forward direction.

For example, the operation of the bidirectional power semiconductor device 1 may be controlled by providing a third gate voltage VMC to the third gate terminal M in the reverse conducting state of the power semiconductor device 1, wherein the power semiconductor device 1 may conduct a load current and or block a voltage in a reverse direction opposite to the forward direction.

In the following, embodiments of a method 2 of operating the power semiconductor device 1 will be described with reference to FIGS. 14, 15A-B, and 16A-B.

The method 2 comprises providing the first control signal VGE to at least one first control electrode 131 so as to operate the power semiconductor device 1 in a forward conducting state, wherein the first control electrode 131 induces the inversion channel within the first channel region 1012. For example, in case the power semiconductor device 1 is an n-channel IGBT, a positive first gate voltage VGE may be provided to the first gate terminal G.

Thus, for example, electrons may enter the drift region 100 via the inversion channel induced within the first channel region 1012. The drift region 100 may thus be flooded with a plasma comprising said electrons and holes, wherein the holes may be injected at a pn-junction at the collector side of the IGBT, such as at a transition between the drift region 100 and the fourth channel region 1042 and/or between the fourth channel region 1042 and the fourth port region 1041.

Figure 14:
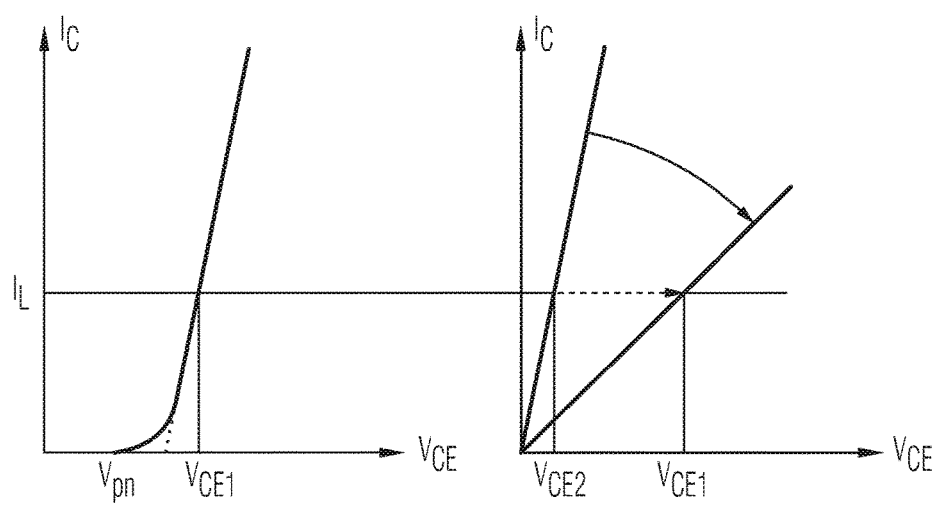
FIG. 14 schematically illustrates current-voltage characteristics in a first and second forward conducting mode accordance with one or more embodiments.

FIG. 14 schematically illustrates on the left-hand side, a current-voltage characteristic corresponding to a first forward conducting mode, in which the third control electrode 135 does not induce an inversion channel within the third channel region. The characteristic depicts a collector current IC in dependence on the forward voltage VCE between the first load terminal C and the second load terminal E. In the first forward conducting mode, the course of the current-voltage characteristic may be characterized by a threshold voltage Vpn, which may result, for example, from a potential barrier at the forward biased pn-junction at the collector side. For voltage values above said threshold voltage Vpn, the current-voltage characteristic exhibits a relatively steep approximately linear section. For example, the power semiconductor device 1 may exhibit a relatively steep current-voltage characteristic and thus a good conductivity in the first forward conducting mode due to the high charge carrier concentration within the drift region 100 resulting from the fully depleted channel regions 1012, 1022, as described above with reference to FIG. 4.

For example, at a given load current IL, the forward voltage VCE may be within the first forward voltage range VCE1. In FIG. 14, the first forward voltage range VCE1 is depicted as a single voltage value. However, it should be noted that the forward voltage VCE at a given load current IL may, in principle, vary within a finite range VCE1 due to various further influences.

In a further step of the method 2, a third control signal VMC may be provided to the at least one third control electrode 135 so as to switch the power semiconductor device 1 from the first forward conducting mode to a second forward conducting mode, wherein the third control electrode 135 induces an inversion channel within the third channel region 1052. For example, in case the power semiconductor device 1 comprises, e.g., an n-channel IGBT, a positive third gate voltage VMC may be provided as a third control signal to the third gate terminal M.

For example, in the second forward conducting mode, the power semiconductor device 1 may exhibit a MOSFET-like current-voltage characteristic, as exemplarily depicted on the right-hand side of FIG. 14. For example, in the second forward conducting mode, the current-voltage characteristic may not exhibit a threshold voltage Vpn, as opposed to the current-voltage characteristic in the first forward conducting mode described above.

For example, immediately after said switching of the power semiconductor device 1 from the first forward conducting mode to the second forward conducting mode, the current-voltage characteristic may exhibit essentially the same (e.g., relatively steep) slope as in the first forward conducting mode. Thus, in the second forward conducting mode, the forward voltage VCE corresponding to the load current IL may be in a second forward voltage range VCE2 (depicted as a single second forward voltage value VCE2 in FIG. 14) comprising lower values then the first forward voltage range VCE1, e.g., due to the absence of the threshold voltage Vpn. This is illustrated by the left graph on the right-hand side of FIG. 14, which corresponds to the situation immediately after the switching from the first forward conducting mode to the second forward conducting mode.

For example, after the switching from the first forward conducting mode to the second forward conducting mode, the slope of the current-voltage characteristic may decrease in the course of time. This is depicted by the transition from the left graph to the right graph on the right-hand side of FIG. 14, wherein the arrow indicates a temporal evolution. The reduction of the slope of the current-voltage characteristic may correspond to a decrease of the conductivity of the power semiconductor device 1, which may be, e.g., due to a decrease of the charge carrier density within the drift region 100.

In an embodiment, the method 2 further comprises providing the third control signal VMC to the at least one third control electrode 135 so as to switch the power semiconductor device 1 from the second forward conducting mode back to the first forward conducting mode before or as soon as the forward voltage VCE has risen to a threshold value. For example, the threshold value is at the lower end of the first forward voltage range VCE1. Alternatively, after operating in the second forward conducting mode, the third control signal VMC may be provided to the at least one third control electrode 135 so as to switch the power semiconductor device 1 from the second forward conducting mode back to the first forward conducting mode. After returning into the first forward conducting mode, the power semiconductor device 1 may be again set to the second conducting mode. Times for operation in one or both of the first and second forward conducting mode may vary with or may be adjusted to the load current 15 carried by the power semiconductor device 1.

For example, initially, the first control signal VGE may be provided to the at least one first control electrode 131 so as to switch the power semiconductor device 1 from a forward blocking state wherein, the first control electrode 131 does not induce said inversion, channel to the forward conducting state. For example, in the forward blocking state, a forward blocking voltage that is externally applied between the first load terminal structure 11 and the second load terminal structure 12 (e.g., via the first load terminal C and the second load terminal E, respectively) may be blocked by a space-charge region formed at a transition between the drift region 100 and at least one of the first channel region 1012 and the second channel region 1022. Then, said switching from the first forward conducting mode to the second forward conducting mode may be carried out with a delay Dt after the power semiconductor device 1 has been switched from the forward blocking state to the forward conducting state. For example, the delay Dt may amount to less than 50 µs, such as less than 10 µs, or even less than 1 µs.

FIGS. 15A-B and 16A-B each schematically illustrate further exemplary switching schemes of the first control signal VGE and the third control signal VMC in accordance with one or more embodiments of the method 2.

Figure 15A:
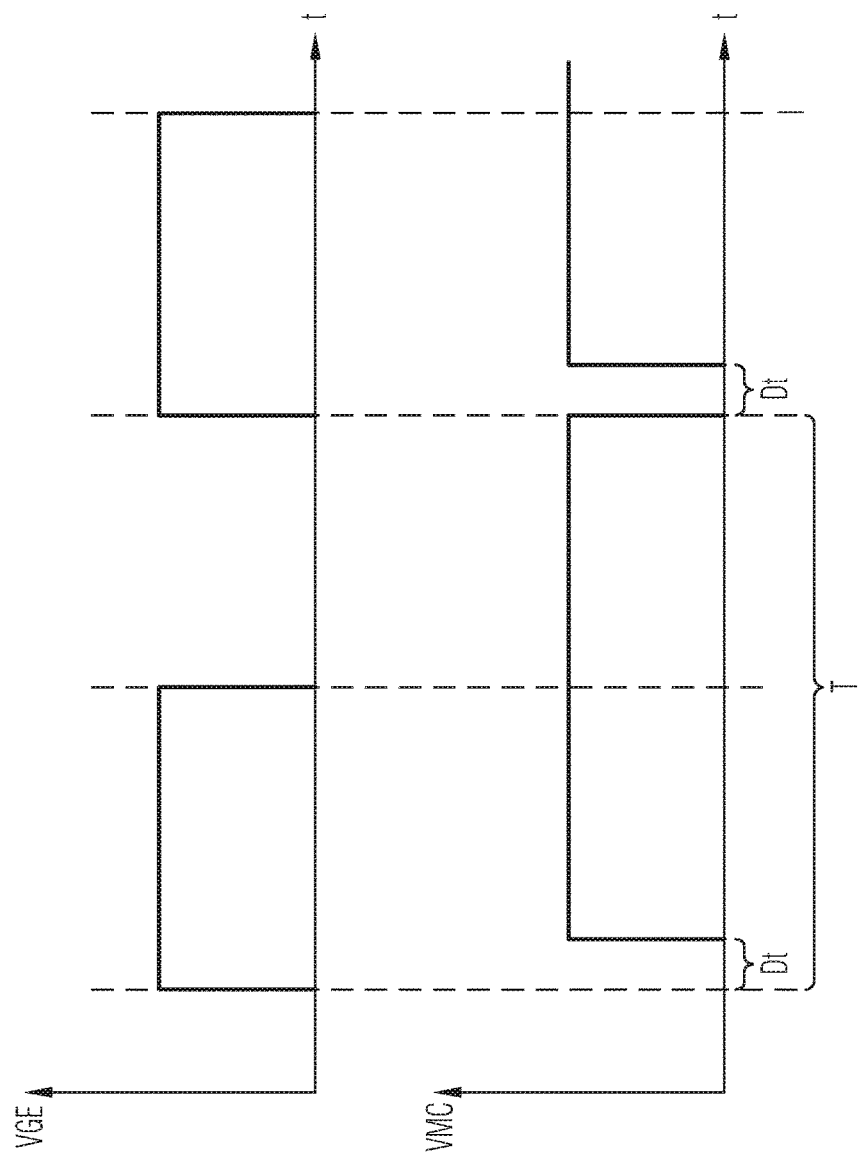

The upper panels of FIGS. 15A-B each depict a section of a periodic switching series of the first control signal VGE between two different values (or ranges of values) of the first gate voltage VGE. For example, the higher value of the gate voltage VGE provided during the first half of the first period having a period time T may be a positive gate voltage VGE, e.g., in the case power semiconductor device 1 comprises an n-channel IGBT. Thus, the power semiconductor device 1 may operate in the forward conducting state during the first half of each period T. After half of the period time T, the power semiconductor device 1 may be switched from the forward conducting state to the forward blocking state by changing the first gate voltage VGE to a lower value, such as 0 or a negative value.

As illustrated in the lower panel of FIGS. 15A-B, also the third control signal VMC is periodically switched between two different values (or ranges of values) of the third gate voltage VMC with the period time T. For example, within each period T, the switching from the first forward conducting mode to the second forward conducting mode may be carried out by increasing the third gate voltage VMC from 0 (or a negative value) to a positive value with a delay Dt after the power semiconductor device 1 has been switched from the forward blocking state to the forward conducting state. For example, the delay Dt may amount to less than 50 µs, such as less than 10 µs, or even less than 1 µs.

In accordance with an embodiment, the delay Dt may amount to less than 10% of the period time T, such as less than 5% of the period time T, or even less than 1% of the period time T.

For example, as shown in the lower panel of FIG. 15A, the power semiconductor device 1 may be kept in the second forward conducting mode by continuously providing the corresponding value of the third gate voltage VMC at least until the power semiconductor device 1 is switched from the forward conducting state to the forward blocking state (i.e., after half of the period time T has elapsed in the exemplary embodiment of FIG. 15A). Alternatively, as shown in the lower panel of FIG. 15B, the power semiconductor device 1 may be switched repeatedly between the first forward conducting mode and the second forward conducting mode before the power semiconductor device 1 is switched from the forward conducting state to the forward blocking state.

As illustrated in both FIGS. 15A and 15B, the third control signal VMC may be provided to the at least one third control electrode 135 so as to induce the inversion channel within the third channel region 1052 also in the forward blocking state of the power semiconductor device 1, i.e., during the second half of the period time T in the exemplary embodiments of FIGS. 15A-B.

Figure 16B:
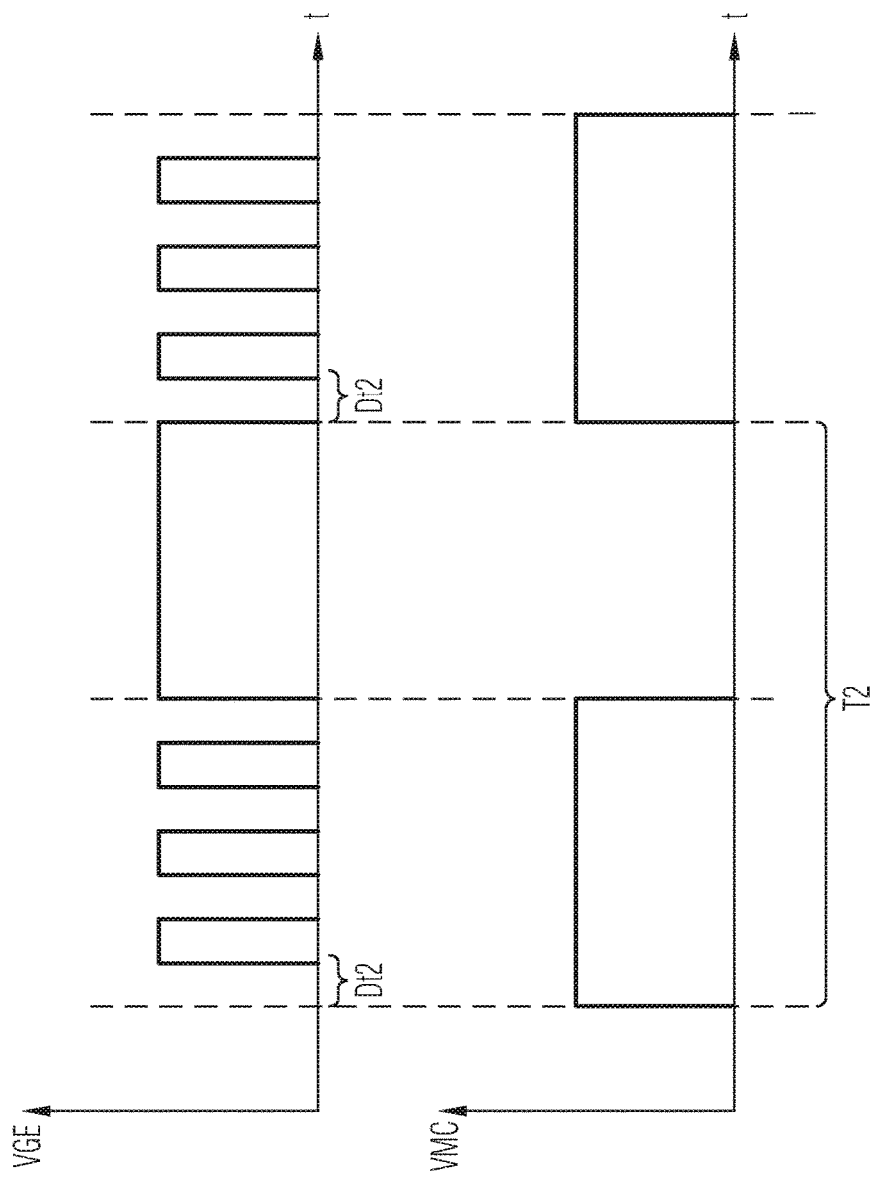

In the embodiment depicted in FIG. 16A, the switching schemes of the first control signal VGE and the second control signal VMC have been exchanged with respect to the switching schemes of FIG. 15A. Likewise, in the embodiment depicted in FIG. 16B, the switching schemes of the first control signal VGE and the second control signal VMC have been exchanged with respect to the switching schemes of FIG. 15B.

What has been stated above in connection with FIGS. 15A-B analogously applies to the exemplary embodiments illustrated in FIGS. 16A-B.

Thus, for example, in accordance with the switching schemes of FIGS. 16A-B, the power semiconductor device 1 may be operated in a reverse conducting state and/or in a reverse blocking state, e.g., in the case of a bidirectional power semiconductor device 1, such as a bidirectional IGBT, or in the case of using the power semiconductor device as a body diode in the reverse conducting state.

Thus, for example, the third control signal VMC may be provided to the at least one third control electrode 135 so as to periodically switch the power semiconductor device 1 between a reverse conducting state, in which the third control electrode 135 induces the inversion channel within the third channel region 1052, and a reverse blocking state (see lower panels of FIGS. 16A-B). For example, in the reverse blocking state, the third control electrodes 135 does not induce said inversion channel within the third channel region 1052 and a reverse blocking voltage that is externally applied between the first load terminal structure 11 and the second load terminal structure 12 may be blocked by the space-charge region formed at a transition between the drift region 100 and the third channel region 1052. For example, said periodic switching may be carried out with a second period time T2.

Further, in the reverse conducting state of the power semiconductor device 1, the first control signal VGE may be provided to the at least one first control electrode 131 so as to switch the power semiconductor device 1 from the first reverse conducting mode, in which the first control told 131 does not induce the inversion channel within the first channel region 1012, to a second reverse conducting mode, in which the first control electrode 131 induces the inversion channel within the first channel region.

For example, as illustrated in FIGS. 16A-B, said switching from the first reverse conducting mode to the second reverse conducting mode may be carried out with a second delay Dt2 after the power semiconductor device 1 has been switched from the reverse blocking state to the reverse conducting state, wherein the second delay Dt2 may amount to amount to less than 50 µs, such as less than 10 µs, or even less than 1 µs.

In accordance with an embodiment, the delay Dt2 may amount to less than 10% of the second period time T2, such as less than 5% of the second period time T2, or even less than 1% of the second period time T2.

The embodiments schematically illustrated in the drawings and described above include the recognition that conduction losses of a power semiconductor device may be reduced by providing means to selectively switch the power semiconductor device between a bipolar conduction mode and a MOSFET-like mode. Thus, in the bipolar conduction mode, a drift region of the power semiconductor device may be flooded with charge carriers forming an electron-hole plasma that ensures a relatively good conductivity. For example, in the case of the power semiconductor device having a fully depleted channel region, a relatively high charge carrier density may be achieved.

Then, the power semiconductor device may be switched into a MOSFET-like mode, e.g, in the case of an IGBT, by inducing an inversion channel via a control electrode provided at the collector side of the IGBT. Initially after the switching from the bipolar conduction mode to the MOSFET-like mode, the forward voltage corresponding to a load current may be reduced due to the inversion channel at the collector side of the IGBT, which bypasses the forward-biased diode at the collector side, thereby avoiding a contribution of the forward-biased diode to the forward voltage. In the course of time, the forward voltage may rise due to a decrease of the charge carrier density and the drift region. This decrease may be relatively slow in case the channel regions at the emitter side of the IGBT are fully depleted. By switching the power semiconductor device back and forth between the bipolar conduction mode and the MOSFET-like mode, a reduction of the conduction losses in operation may be achieved.

In accordance with an embodiment, in a power semiconductor device having fully depletable channel regions within first and second cells, which are electrically connected to a first load terminal for controlling a load current, an third cell is further provided, wherein the third cell is electrically connected to a second load terminal. The third cell may comprise a third control electrode which may be configured to induce an inversion channel within a third channel region of the third cell in dependence on a third control signal. By means of the third cell, the power semiconductor device may be switched between a first forward conducting mode (corresponding, e.g., to a bipolar conduction mode) and a second forward conducting mode (corresponding, e.g., to a MOSFET-like mode) so as to reduce the conduction losses.

In accordance with a variant embodiment, the power semiconductor device may further comprise a fourth cell that is electrically connected to the second load terminal. The fourth cell may be configured to induce an accumulation channel within a fourth channel region of the fourth cell. For example, a bidirectional power semiconductor device having fully depletable channel regions, such as a bidirectional IGBT having fully depletable channel regions, may thus be provided.

In accordance with further embodiments, a method of operating a power semiconductor device comprises switching the power semiconductor device between at least the first forward conducting mode and the second forward conducting mode by providing a corresponding third control signal to the at least one third control electrode.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to a power semiconductor device and to methods of processing a power semiconductor device were explained. For example, these embodiments are based on silicon (Si). Accordingly, a monocrystalline semiconductor region or layer, e.g., the semiconductor regions 10, 100, 101, 1011, 1012, 1013, 102, 1021, 1022, 1023, 103, 103-1, 104, 1041, 1042, 105, 1051, 1052 of exemplary embodiments, can be a monocrystalline Si-region or Si-layer. In other embodiments, polycrystalline or amorphous silicon may be employed.

It should, however, be understood that the semiconductor regions 10, 100, 101, 1011, 1012, 1013, 102, 1021, 1022, 1023, 103, 103-1, 104, 1041, 1042, 105, 1051, 1052 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor device, comprising:
a semiconductor body coupled to a first load terminal structure and a second load terminal structure and configured to conduct a load current;
a first cell and a second cell, each being configured for controlling the load current and each being electrically connected to the first load terminal structure on the one side and electrically connected to a drift region of the semiconductor body on the other side, the drift region having a first conductivity type;
a first mesa included in the first cell, the first mesa including: a first port region having the first conductivity type and being electrically connected to the first load terminal structure, and a first channel region being coupled to the drift region;
a second mesa included in the second cell, the second mesa including: a second port region having the second conductivity type and being electrically connected to the first load terminal structure, and a second channel region being coupled to the drift region;
each of the first mesa and the second mesa being spatially confined, in a direction perpendicular to a direction of the load current within the respective mesa, by a first insulation structure and exhibiting a total extension of less than 100 nm in said direction;
wherein the power semiconductor device further comprises a third cell being electrically connected to the second load terminal structure on the one side and electrically connected to the drift region on the other side; wherein the third cell includes a third mesa comprising: a third port region having the first conductivity type and being electrically connected to the second load terminal structure; a third channel region being coupled to the drift region; and a third control electrode being insulated from the third mesa by a second insulation structure.

2. The power semiconductor device of claim 1, wherein the third control electrode is configured to induce an inversion channel within the third channel region.

3. The power semiconductor device of claim 1, wherein the third mesa is spatially confined, in a direction perpendicular to a direction of the load current within the third mesa, by the second insulation structure and exhibits a total extension of less than 100 nm in said direction.

4. The power semiconductor device of claim 1, wherein:
the first cell is configured to induce an inversion channel within the first channel region; and
the second cell is configured to induce an accumulation channel within the second channel region.

5. The power semiconductor device of claim 4, wherein the first cell comprises a first control electrode for inducing said inversion channel, and wherein the first insulation structure insulates the first control electrode from the first mesa.

6. The power semiconductor device of claim 4, wherein the second cell comprises a second control electrode for inducing said inversion channel, and wherein the first insulation structure insulates the second control electrode from the second mesa.

7. The power semiconductor device of claim 1, further comprising a fourth cell being electrically connected to the second load terminal structure on the one side and electrically connected to the drift region on the other side; wherein the fourth cell includes a fourth mesa comprising: a fourth port region having the second conductivity type and being electrically connected to the second load terminal structure, and a fourth channel region being coupled to the drift region.

8. The power semiconductor device of claim 7, wherein the fourth mesa is spatially confined, in a direction perpendicular to a direction of the load current within the fourth mesa, by the second insulation structure and exhibits a total extension of less than 100 nm in said direction.

9. The power semiconductor device of claim 7, wherein the fourth cell is configured to induce an accumulation channel within the fourth channel region.

10. The power semiconductor device of claim 9, wherein the fourth cell comprises a fourth control electrode for inducing said inversion channel, and wherein the second insulation structure insulates the second control electrode from the fourth mesa.

11. The power semiconductor device of claim 1, wherein the drift region comprises a buffer region in contact with the third cell and/or the fourth cell, the buffer region having the first conductivity type at a higher dopant concentration as compared to the dopant concentration of the drift region external of the buffer region.

12. A method of operating a power semiconductor device, wherein the power semiconductor device comprises:
a semiconductor body coupled to a first load terminal structure and a second load terminal structure and configured to conduct a load current;
a first cell, a second cell, and a third cell each being configured for controlling the load current, wherein each of the first cell and the second cell are electrically connected to the first load terminal structure on the one side and electrically connected to a drift region of the semiconductor body on the other side, and wherein the third cell is electrically connected to the second load terminal structure on the one side and electrically connected to the drift region on the other side, the drift region having a first conductivity type;
a first mesa included in the first cell, the first mesa including: a first port region having the first conductivity type and being electrically connected to the first load terminal structure, and a first channel region being coupled to the drift region;
a second mesa included in the second cell, the second mesa including: a second port region having the second conductivity type and being electrically connected to the first load terminal structure, and a second channel region being coupled to the drift region;
a third mesa included in the third cell, the third mesa including: a third port region having the first conductivity type and being electrically connected to the second load terminal structure, and a third channel region being coupled to the drift region;
each of the first mesa and the second mesa being spatially confined, in a direction perpendicular to a direction of the load current within the respective mesa, by the first insulation structure and exhibiting a total extension of less than 100 nm in said direction;
at least one first control electrode configured to induce an inversion channel within the first channel region;
at least one third control electrode configured to induce an inversion channel within the third channel region;
wherein the method comprises:
providing a first control signal to the at least one first control electrode so as to operate the power semiconductor device in a forward conducting state, in which the first control electrode induces the inversion channel within the first channel region; and
in the forward conducting state, providing a third control signal to the at least one third control electrode so as to switch the power semiconductor device from a first forward conducting mode, in which the third control electrode does not induce the inversion channel within the third channel region, to a second forward conducting mode, in which the third control electrode induces the inversion channel within the third channel region.

13. The method of claim 12, wherein, in the forward conducting state, the power semiconductor device exhibits a forward voltage between the first load terminal structure and the second load terminal structure while conducting a load current, and wherein:
in the first forward conducting mode, the forward voltage is in a first forward voltage range, and
in the second forward conducting mode, the forward voltage is in a second forward voltage range, wherein the second forward voltage range comprises lower values than the first forward voltage range.

14. The method of claim 13, further comprising providing the third control signal to the at least one third control electrode so as to switch the power semiconductor device from the second forward conducting mode back to the first forward conducting mode before or as soon as said forward voltage has risen to a threshold value.

15. The method of claim 14, wherein said threshold value is at a lower end of the first forward voltage range.

16. The method of claim 12, further comprising providing the first control signal to the at least one first control electrode so as to periodically switch the power semiconductor device between a forward blocking state and the forward conducting state, wherein, in the forward blocking state, the first control electrode does not induce said inversion channel and a voltage that is externally applied between the first load terminal structure and the second load terminal structure is blocked by a space-charge region formed at a transition between the drift region and at least one of the first channel region and the second channel region.

17. The method of one of claim 16, wherein, within each period of said periodical switching between the forward blocking state and the forward conducting state, said switching from the first forward conducting mode to the second forward conducting mode is carried out with a delay after the power semiconductor device has been switched from the forward blocking state to the forward conducting state, wherein the delay amounts to less than 50 µs.

18. The method of claim 12, further comprising:
providing the first control signal to the at least one first control electrode so as to operate the power semiconductor device in a forward blocking state, wherein:
the first control electrode does not induce said inversion channel within the first channel region; and
a forward blocking voltage that is externally applied between the first load terminal structure and the second load terminal structure is blocked by a space-charge region formed at a transition between the drift region and at least one of the first channel region and the second channel region; and
while the power semiconductor device is in the forward blocking state,
providing the third control signal to the at least one third control electrode so as to induce said inversion channel within the third channel region.

19. The method of claim 12, further comprising:
providing the third control signal to the at least one third control electrode so as to operate the power semiconductor device in a reverse conducting state, in which the third control electrode induces the inversion channel within the third channel region; and
in the reverse conducting state, providing the first control signal to the at least one first control electrode so as to switch the power semiconductor device from a first reverse conducting mode, in which the first control electrode does not induce the inversion channel within the first channel region, to a second reverse conducting mode, in which the first control electrode induces the inversion channel within the first channel region.

20. The method of claim 12, further comprising:
providing the third control signal to the at least one third control electrode so as to operate the power semiconductor device in a reverse blocking state, wherein:
the third control electrode does not induce said inversion channel within the third channel region; and
a reverse blocking voltage that is externally applied between the first load terminal structure and the second load terminal structure is blocked by a space-charge region formed at a transition between the drift region and the third channel region; and
while the semiconductor device is in the reverse blocking state, providing the first control signal to the at least one first control electrode so as to induce said inversion channel within the first channel region.

21. The method of claim 12, wherein the first control signal is provided in the form of a first gate voltage that is applied between a first load terminal being electrically connected with the first load terminal structure and a first gate terminal being electrically connected with the first control electrode.

22. The method of claim 12, wherein the third control signal is provided in the form of a third gate voltage that is applied between a second load terminal being electrically connected with the second load terminal structure and a third gate terminal being electrically connected with the third control electrode.

* * * * *